(12) United States Patent
Yamasaki et al.

(10) Patent No.: US 6,337,810 B1
(45) Date of Patent: Jan. 8, 2002

(54) SEMICONDUCTOR MEMORY DEVICE AND METHOD FOR READING DATA

(75) Inventors: Kazuyuki Yamasaki, Tokyo; Tonomi Egawa, Kawasaki, both of (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/688,324

(22) Filed: Oct. 12, 2000

(30) Foreign Application Priority Data

Oct. 18, 1999 (JP) ............................................ 11-295939

(51) Int. Cl.[7] .............................................. G11C 7/00
(52) U.S. Cl. .............. 365/189.05; 365/236; 365/230.06
(58) Field of Search ........................... 365/189.05, 236, 365/230.06, 205

(56) References Cited

U.S. PATENT DOCUMENTS 5,892,730 A * 4/1999 Sato et al. ............ 365/189.05 X
6,134,169 A * 10/2000 Tanaka .................. 365/189.04 X
6,240,046 B1 * 5/2001 Proebsting ............ 365/189.05 X

* cited by examiner

Primary Examiner—Huan Hoang

(57) ABSTRACT

The provision of a semiconductor memory device for which access times in burst mode can be improved with no increase in the chip surface area and with no increase in power consumption. A latch pulse selection circuit 6 uses a control signal CA0T to output an input control signal SALF and a control signal SALS, to a first latch group within a latch circuit 7 as a latch pulse SAL0A, and to a second latch group within the latch circuit 7 as a latch pulse SAL1A, respectively. Based on a control signal $YS_0 \sim YS_{31}$ input from a column decoder circuit 11, a Y selector 12 is connected to a sense amplifier circuit 8 via Y switches connected to the corresponding digit lines. The sense amplifier circuit 8 comprises 256 sense amplifiers, and performs data evaluations of the signal $YD_0 \sim$ signal $YD_{127}$ from the Y selector. A latch circuit 7 latches a data signal $DT_0 \sim$ data signal $DT_{127}$ from the sense amplifier circuit 8 into a first latch group and a second latch group via latch signals SAL0 and SAL1 respectively.

11 Claims, 13 Drawing Sheets

SEMICONDUCTOR MEMORY DEVICE AND METHOD FOR READING DATA

BACKGROUND OF THE INVENTION

1. Field of the Invention

The present invention relates to a semiconductor memory device with a burst access mode capable of high speed readout, which can be used in devices such as memory cards.

2. Background Art

Recently, advances in processor technology have increased the degree of integration of semiconductor memory devices as well as the operating speed. The increase in the operating speeds of CPUs (central processing units) has been particularly marked. As a result, it is necessary to be able to read program data stored in semiconductor memory devices at high speeds corresponding with the operating speed of the CPU, and so an increase in the operating speed of semiconductor memory devices during readout has been required.

In particular, it is now possible to store musical information or graphical information such as animation on a single semiconductor chip, and then playback the musical information through speakers, or playback the graphical information on a display screen of a display device. If there is a variation in the read speed during read processing of the musical information or graphical information, then the music or graphics being played back may be interrupted and become non-continuous, causing a sense of incongruity for the user.

Consequently, for the readout of this type of musical information or graphical information, both a high speed, and a constant read speed are required.

The demand for high speed access of the aforementioned semiconductor memory devices, has seen the application of burst mode to the operation of such semiconductor memory devices. In burst mode for example, during the burst readout of data, when a reference address is provided to the semiconductor memory device, the data corresponding to the page is read to a latch at a time, and then based on a read enable signal at the semiconductor memory device, the necessary addresses for subsequent burst read processing from the aforementioned latch are generated sequentially within an internal circuit, thereby reading the data within the latch. Consequently, there is no necessity to read in the addresses anew, and so the access during memory readout occurs at high speed.

For example, as shown in FIG. 13, the data from the 16 bytes of memory cells between byte 0~byte 15 is read during a latency period, and then while this data from byte 0~byte 15 is being output, the data from the 16 bytes of memory cells between byte 16~byte 31 is read. This read processing then repeats sequentially.

However, in the burst mode described above, on the completion of the readout of each page, the address of the next page is provided anew to the semiconductor memory device. As a result, the time taken for decode processing of the input address, that is, the time for page readout from the memory cells by the sense amplifier, is required, and a signal is retained for external control of the semiconductor memory device. In particular, as shown in FIG. 14, in the case of readout from a point partway through the 16 bytes, such as from the $15^{th}$ byte, there is only the read time for a single byte in which to read from the memory cells all the data for byte 16~byte 31, and so continuous data output is not achievable.

Consequently, in the method described above wherein a single page of data of a semiconductor memory device is latched, there is a practical limit to improvements in access time for high speed access. As a result, systems which utilize this type of semiconductor memory device suffer from the drawback that the processing speed of the entire system cannot be improved.

In order to resolve the above drawback, a sense amplifier and latch may be provided for every bit line used for memory data readout, so as to remove the requirement for a new address to be input every time the page is switched (Japanese Patent Application, First Publication No. Hei-9-106689).

As a result, because the data from all bit lines is read at a time and then stored in the respective latches, then with the exception of a change in the word line, high speed reading and writing can be carried out without the input of a new address. Consequently, systems which utilize this type of semiconductor memory device do not require a page read time on page switching, and so the overall processing speed can be improved.

However, in the above type of semiconductor memory device, because every bit line has a corresponding sense amplifier and a latch for storing the data from the sense amplifier, although access can be conducted at high speed, the area of the chip occupied by the sense amplifiers and latches is extremely large, and so in comparison with a normal semiconductor memory device of the same capacity, the chip surface area will be very large.

Furthermore, in the above type of semiconductor memory device, because every bit line has a corresponding sense amplifier and a latch for storing the data from the sense amplifier, the electric power consumption during operations such as data readout is extremely high, and so when used in battery driven portable information apparatus, the operating time of the portable information apparatus will be significantly shortened.

As a method of solving the aforementioned drawbacks of semiconductor memory devices, a read ciucuit construction which reduces the number of sense amplifiers has been proposed (Japanese Patent Application, First Publication No. Hei-11-176185), wherein the memory cell array is divided into a plurality of blocks, and a single sense amplifier is shared across the plurality of columns within each block. In such a case, in the plurality of blocks, the data of the selected columns is treated as a single set of data.

However, in the read circuit described above, when the first set of data is transferred from the sense amplifier to the shift register, an increment is added to the column address, and the second set of data is read to the sense amplifier. Then, when the last piece of data of the first set of data transferred to the shift register has been output, the second set of data is transferred into the shift register of the read circuit, another increment is added to the column address, and processing is carried out to read the third set of data into the sense amplifiers.

Consequently, the read circuit begins data output from the shift register after a predetermined random access time (for example, 1 $\mu$sec) has passed. As a result, the read circuit is not equipped with a device for detecting, at the time when the output of the first set of data has been completed, whether or not evaluation of the second set of data by the sense amplifier has been completed.

Consequently, in those cases where the random access time of an external circuit or circuit device is, short relative to the access time of the semiconductor memory device, then at the point where the output of the first set of data is completed, the external circuit or circuit device will begin reading, assuming that the second set of data is being output from the shift register, even though the reading of that second set of data to the shift register is still incomplete, and consequently there is a danger that inaccurate reading of the data will occur.

Furthermore, because when the first set of data is transferred from the sense amplifier to the shift register, the read circuit adds an increment to the column address and begins readout of the second set of data to the sense amplifier, the sense amplifier is continually in an active state. Consequently, the read circuit suffers from large current consumption, as a current is continually flowing through the sense amplifier.

SUMMARY OF THE INVENTION

The present invention has been developed with consideration of these background circumstances, with an object of providing a semiconductor memory device which is capable of improving burst mode access time with no increase in chip surface area, and no increase in power consumption.

A first aspect of the present invention is a semiconductor memory device comprising a memory cell array with a plurality of arranged memory cells which are selected by a column address and a row address; a bit line selection circuit for selecting, based on the column address, a group comprising a predetermined number of bit lines, from bit lines connected with the plurality of memory cells selected by the row address; a sense amplifier section comprising sense amplifiers for determining for each bit line output signals from memory cells input through the plurality of bit lines of the selected group, and outputting data from each of the bit lines as an evaluation result; a first latch group and a second latch group connected in common to the sense amplifier section, for storing the data of each bit line output from the sense amplifier section; and a latch selection circuit for selecting which of the first latch group data and the second latch group data to output, and then outputting a selection result as read data; wherein during burst read operation, in cases where data of the first latch group is being output as read data, the second latch group stores data from the sense amplifier, and in cases where data of the second latch group is being output as read data, the first latch group stores data from the sense amplifier.

A second aspect of the present invention is a semiconductor memory device according to the first aspect, wherein the first latch group and the second latch group latch continuous data during a latency period.

A third aspect of the present invention is a semiconductor memory device according to either one of the first aspect and the second aspect, further equipped with a sense amplifier control device, wherein when data is being stored from the sense amplifier into either one of the first latch group and the second latch group, the sense amplifier is set to an active state, and when data has been stored in either one of the first latch group and the second latch group, the sense amplifier is set to a non-active state.

A fourth aspect of the present invention is a semiconductor memory device according to any one of the first aspect through the third aspect, further comprising a detection signal generation circuit for detecting, during latching of continuous data to the first latch group and the second latch group during a latency period, when latching of data from both the first latch group and the second latch group has been completed, and outputting a detection signal.

A fifth aspect of the present invention is a semiconductor memory device according to any one of the first aspect though the fourth aspect, farther comprising a counter for setting an input address as an initial value for a burst read column address, and counting from the set initial value each time a read signal is input, and generating a burst address.

A sixth aspect of the present invention is a semiconductor memory device according to the fifth aspect, wherein the counter comprises a first counter for generating a burst address for selecting which of the read data output from the first latch and the second latch will be output from an output terminal, and a second counter for generating a burst address which functions as a selection signal for selecting, from bit lines connected to selected memory cells, those bit lines of the group for connection to a sense amplifier.

A seventh aspect of the present invention is a semiconductor memory device according to the fifth aspect, wherein the counter comprises a first counter for generating a burst address for selecting which of the read data output from the first latch and the second latch will be output from an output terminal, a second counter for generating a burst address which functions as a selection signal for selecting, from bit lines connected to selected memory cells, those bit lines of the group for connection to a sense amplifier, and a third counter for generating a burst address which functions as a column address.

An eighth aspect of the present invention is a method of reading data from a semiconductor memory device comprising a first step for selecting from a memory array with a plurality of arranged memory cells which are selected by a column address and a row address, a plurality of the memory cells based on the row address; a second step in which a bit line selection circuit selects a group comprising a predetermined number of bit lines based on the column address, from bit lines connected with selected the plurality of memory cells; a third step in which a sense amplifier section for determining output signals from memory cells, input via the plurality of bit lines of the selected group, using a sense amplifier corresponding with each bit line, and outputs data from each of the bit lines as an evaluation result; a fourth step in which either one of a first latch and a second latch connected in common to the sense amplifier section stores the data of each bit line output from the sense amplifier section; and a fifth step in which a latch selection circuit selects which of the first latch data and the second latch data to output, and then outputs selected latch data as read data; wherein during burst read operation, in cases where data of the first latch is being output as read data, the second latch stores data from the sense amplifier, and in cases where data of the second latch is being output as read data, the first latch stores data from the sense amplifier.

A ninth aspect of the present invention is a method of reading data from a semiconductor memory device according to the eighth aspect, wherein the first latch group and the second latch group latch continuous data during a latency period A tenth aspect of the present invention is a method of reading data from a semiconductor memory device according to either one of the eighth aspect and the ninth aspect, further comprising a sense amplifier control device, wherein when data is being stored from the sense amplifier into either one of the first latch group and the second latch group, the sense amplifier is set to an active state, and when data has been stored in either one of the first latch group and the second latch group, the sense amplifier is set to a non-active state.

An eleventh aspect of the present invention is a method of reading data from a semiconductor memory device according to any one of the eighth aspect through the tenth aspect, further comprising a detection signal generation circuit for detecting, during latching of continuous data to the first latch group and the second latch group during a latency period, when latching of data from both the first latch group and the second latch group has been completed, and outputting a detection signal.

DETAILED DESCRIPTION OF THE INVENTION

Figure 1:
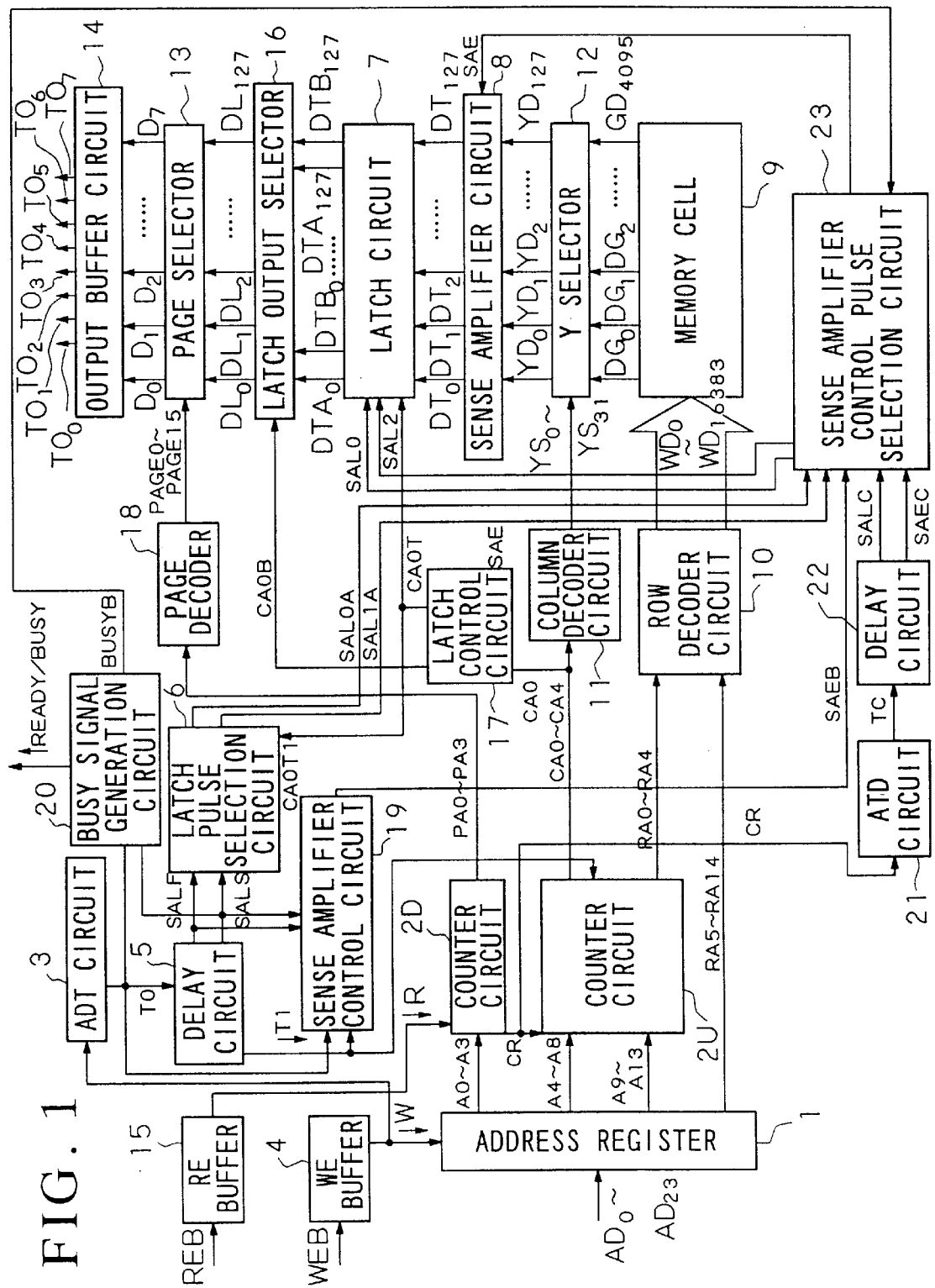
FIG. 1 is a block diagram showing the construction of a semiconductor memory device according to an embodiment of the present invention.

As follows is a description of embodiments of the present invention with reference to the drawings. FIG. 1 is a block diagram showing the construction of a semiconductor memory device according to an embodiment of the present invention. Furthermore, although FIG. 1 shows, as an example, the construction of an 8 bit output mask ROM (read only memory) with a capacity of 128 Mbit (megabits), the present invention is in no way limited to this type of mask ROM.

In the diagram, an address register 1 performs waveform shaping of a 24 bit input of address signal $AD_0$ to address signal $AD_{23}$ which is input from externally in three segments via an 8 bit terminal, converts the input to an internal circuit voltage level, and then produces an internal signal by modification to an internal address signal A0 to internal address signal A13 and a row address signal RA5 to row address RA14. Furthermore, the address register 1 latches the internal address signal A0 to internal address signal A13 and the internal address signal RA5 to internal address signal RA14 at the rising edge of a signal W, for example. Then, the address register 1 outputs the latched internal address signal A0 to internal address signal A3 to a counter circuit 2D, and outputs the internal address signal A4 to internal address signal A13 to a counter circuit 2U.

The counter circuit 2D is a 4 bit counter which latches the input internal address signal A0 to internal address signal A3 at a timing marked by the rise of a control signal T0. That is, the counter circuit 2D latches the internal address signal A0 to internal address signal A3 as an initial burst address value via the rising edge of the control signal T0. Furthermore, the counter circuit 2D conducts counting operations, via the rising edge of a read signal R, from the numerical value of this latched internal address signal.

Furthermore, the counter circuit 2D outputs the count result as a page address signal PA0 to page address signal PA3 to a page decoder circuit 18 (refer to FIG. 1). When the count is increased and the count value changes from "1111" to "0000", a count up signal CR is output to the counter circuit 2U. The most significant bit in the count value a "1111" is the value of the page address signal PA3, and the least significant bit is the value of the page address signal PA0.

The counter circuit 2U is a 10 bit counter which latches the input internal address signal A4 to internal address signal A13 at a timing marked by the rise of a control signal T0. That is, the counter circuit 2U latches the internal address signal A4 to internal address signal A13 as an initial burst address value via the rising edge of the control signal T0. Furthermore, the counter circuit 2U conducts counting operations, via the rising edge of a control signal T1 or the rising edge of a carrier signal CR, from the numerical value of this latched internal address signal.

Furthermore, the counter circuit 2U uses the 5 least significant bits of the 10 bits for generating a column address signal CA0 to column address signal CA4 with the input address signal A4 to address signal A8 as an initial value, and then outputs this signal to a column decoder circuit 11. Furthermore, the counter circuit 2U uses the 5 most significant bits of the 10 bits for generating a row address signal RA0 to row address signal RA4 with the input address signal A9 to address signal A13 as an initial value, and then outputs this signal to a row decoder circuit 10. At this point, the row address signal RA0 to row address signal RA4 is combined with the row address signal RA5 to row address signal RA14 output from the address register 1, to output a row address signal RA0 to address signal RA14 to the row decoder circuit 10.

As a result, the counter circuit 2U is of a construction which corresponds with the burst mode for reading data incorporating a word selection line, and from the row address signal RA0 to row address signal RA14 and from within the range of the enumerated data of the row address signal RA0 to row address signal RA4 where the initial value of the burst address is set as the address signal A9 to address signal A13, generates a burst address for performing the transition to activation for the word selection line (the word line selection) from the word selection line $WD_0$ to word selection line $WD_{16383}$.

A WE buffer 4 performs waveform shaping and conversion to the voltage levels of internal circuits for a signal WEB input from externally, and outputs, as a result of the conversion, an in-phase write signal W.

An ADT circuit 3 detects alterations of the write signal W input from the WE buffer 4, and in those cases where the write signal W has altered, outputs for example, as a detection result, a control signal T0 in the form of a level "H" one shot pulse of a predetermined width, to the counter circuit 2U and a delay circuit 5.

The delay circuit 5 delays the input level "H" pulse control signal T0, and outputs as a delay result, a control signal T1 comprising a pulse of predetermined width with an identical polarity (H level) with that of the control signal T0. Furthermore, by using timings generated by addition of preset time delays, the delay circuit 5 delays the control signal T0 and generates a control signal SALF comprising a pulse with an opposite polarity (L level) to that of the control signal T0 of predetermined width, and delays the level "H" pulse of the control signal T1 to generate a control signal SALS comprising a pulse, of predetermined width, with an opposite polarity (L level) to that of the control signal T1, and then outputs the control signal SALF and the control signal SALS to a latch pulse selection circuit 6.

The latch pulse selection circuit 6 outputs the input control signal SALF and the control signal SALS, via a control signal CA0T, as a latch pulse SAL0A which functions as a latch signal for a first latch group within a latch circuit 7, and a latch pulse SAL1A which functions as a latch signal for a second latch group within a latch circuit 7, respectively.

That is, when the control signal CA0T is at the level "L", the latch pulse selection circuit 6 outputs the control signal SALF as the control signal SAL0A, and outputs the control signal SALS as the control signal SAL1A. In contrast, when the control signal CA0T is at level "H", the latch pulse selection circuit 6 outputs the control signal SALF as the control signal SAL1A, and outputs the control signal SALS as the control signal SAL0A.

Consequently, the output latch pulse SAL0A and the latch pulse SAL1A are output as pulses of predetermined width with polarities identical (level "H") with the control signal SALS or the control signal SALF.

A RE buffer 15 performs waveform shaping and conversion to the voltage levels of internal circuits for a RE signal input from externally, and outputs, as a result of the conversion, a read signal R of the same phase.

The row decoder circuit 10 performs decoding processing of the row address signal RA0 to row address signal RA4 input from the counter circuit 2U, and the row address signal RA5 to row address signal RA14 input from the address register 1, activates one line from the word selection line WD0~word selection line WD16383, applies a level "L" voltage to the gate of the memory transistor connected to this word line in the memory cell 10, deactivates all of the word selection lines except for the selected line, and then applies a level "H" voltage greater than the threshold level of an enhancement type memory transistor) to the gate of the memory transistor connected to this word line in the memory cell 10.

The column decoder circuit 11 performs decoding processing of the column address signal CA0 to row address signal CA4 input from the counter circuit 2D, activates (level "H") one line from control signal $YS_0$ to control signal $YS_{31}$ in order to switch a Y selector 12 comprising a Y switch (an n-channel type transistor) to the ON state, and applies a level "H", voltage to the gate of the Y switch. Here, a Y switch comprising a transistor is connected to each of the digit lines $DG_0$ to digit line $DG_{4095}$.

A memory cell 9 comprises word selection line $WD_0$ to word selection line $WD_{16383}$ and digit (bit) line $DG_0$ to digit line $DG_{8192}$ arranged as an intersecting matrix, and at each intersection is provided a memory cell transistor not shown in the drawing. The memory cell is of a NAND type, and the information stored by the memory cell transistors is displayed by the threshold of the transistor. That is, with this type of NAND connection, in those cases where, for example, the memory cell transistors are of the n-channel variety, then a "1" is displayed as the depression form by ion implantation of n-type impurities into the gate of the memory cell transistor, whereas "0" is displayed as the enhancement form by conducting no ion implantation at the gate of the memory cell transistor.

Being of a NAND type, for the memory cell transistors (n-channel type), in which the source and the drain are each connected to different memory transistors, the gate of each memory cell transistor is connected to one of the word selection lines $WD_0$ to word selection line $WD_{16383}$, and the source of the final stage memory cell transistor is grounded, and the drain of the first stage memory transistor is connected to digit line $DG_0$ (digit line $DG_1$ to digit line $DG_{8192}$). In such a case, if the word selection line $WD_0$ is activated (to the level "L" state) and the other word selection lines are deactivated (level "H" state), then an information current of a current value corresponding to the data stored in the memory transistor for which the gate thereof is connected to the activated word line $WD_0$, flows into the digit line $DG_0$, and this information current (data signal $YD_0$ to data signal $YD_{127}$) is output to a sense amplifier circuit 8.

That is, in the case where the data "1" is written into the memory transistor for which the gate thereof is connected to the activated word selection line, a current will flow because the memory transistor is in the depression form. In contrast, in the case where the data "0" is written into the memory transistor for which the gate thereof is connected to the activated word selection line, a current will not flow because the memory transistor is in the enhancement form.

Here, the voltage of the activated word selection line is set to a value lower than the threshold of a memory transistor in enhancement form, and the enhancement form memory transistors set to an off state, preventing current flow.

Furthermore, the voltage of a deactivated word selection line is set to a value higher than the threshold of a memory transistor in enhancement form, and the enhancement form memory transistors set to an ON state, thereby enabling current flow. (The memory transistors other than the selected memory transistor are set to a conduction state, together with the wiring).

Hence, when a "1" signal is written to the selected memory transistor, an information current will flow from the first stage memory cell transistor drain, through the last stage memory cell transistor source, to the ground point.

In contrast, when a "0" signal is written to the selected memory transistor, an information current will not flow from the first stage memory cell transistor drain, through the last stage memory cell transistor source, to the ground point. Thus, the aforementioned information current will show the data stored in the memory cell transistor. As a result, the information current which flows into digit line $DG_0$ to digit line $DG_{8192}$ is supplied to the sense amplifier circuit 8 via the Y selector 12.

In the Y selector, when any of the control signals $YS_0$ to control signal $YS_{31}$ which are input from the column decoder circuit 11 are activated (set to level "H"), then a Y switch connected to the gate of the activated control signal (control signal $YS_0$ to control signal $YS_{31}$) is switched ON, and the 128 digit lines which correspond with the sense amplifier circuit 8 are each connected via the Y switch connected to each digit line. For example, if the column decoder circuit 11 activates the control signal $YS_0$, then, in the Y selector 12, the Y switches connected to digit line $DG_0$ to digit line $DG_{15}$, digit line $DG_{512}$ to digit line $DG_{527}$, digit line $DG_{1024}$ to digit line $DG_{1039}$, digit line $DG_{1536}$ to digit line $DG_{1551}$, digit line $DG_{2048}$ to digit line $DG_{2063}$, digit line $DG_{2560}$ to digit line $DG_{2575}$, digit line $DG_{3072}$ to digit line $DG_{3087}$, and digit line $DG_{3584}$ to digit line $DG_{3599}$, (1 page of data) are switched ON, and the digit line $DG_0$ to digit line $DG_{15}$, digit line $DG_{512}$ to digit line $DG_{527}$, digit line $DG_{1024}$, to digit line $DG_{1039}$, digit line $DG_{1536}$ to digit line $DG_{1551}$, digit line $DG_{2048}$ to digit line $DG_{2063}$, digit line $DG_{2560}$ to digit line $DG_{2575}$, digit line $DG_{3072}$ to digit line $DG_{3087}$, and digit line $DG_{3584}$, to digit line $DG_{3599}$ are each connected to the sense amplifier circuit 8 via a Y switch, and the information current flowing through each of the digit lines connected to the sense amplifier circuit 8 is then output to the sense amplifier circuit 8 as a signal $YD_0$~signal $YD_{127}$.

Of the digit lines $DG_0$ to digit line $DG_{4095}$, then for example, the digit lines from each of digit line $DG_0$ to digit line $DG_{511}$, digit line $DG_{512}$ to digit line $DG_{1023}$, digit line $DG_{1024}$ to digit line $DG_{1535}$, digit line $DG_{1536}$ to digit line $DG_{2047}$, digit line $DG_{2048}$ to digit line $DG_{2559}$, digit line $DG_{2560}$ to digit line $DG_{3071}$, digit line $DG_{3072}$ to digit line $DG_{3583}$, and digit line $DG_{3584}$ to digit line $DG_{4095}$ will correspond to each of the output terminals $TO_0$ to output terminal $TO_7$ respectively.

For example, within dint line $DG_0$ to digit line $DG_{511}$, digit line $DG_0$ to digit line $DG_{15}$ corresponds to the output terminal $TO_0$, digit line $DG_{16}$ to digit line $DG_{31}$ corresponds to the output terminal $TO_1$, digit line $DG_{32}$ to digit line $DG_{47}$ corresponds to the output terminal $T0_2$, digit line $DG_{48}$~digit line $DG_{63}$ corresponds to the output terminal $TO_3$, digit line $DG_{64}$ to digit line $DG_{79}$ corresponds to the output terminal $TO_4$, digit line $DG_{80}$ to digit line $DG_{95}$ corresponds to the output terminal $TO_5$, digit line $DG_{96}$ to digit line $DG_{111}$ corresponds to the output terminal $TO_6$, and digit line $DG_{112}$ to digit line $DG_{127}$ corresponds to the output terminal $TO_7$.

Then, from the data of digit line $DG_0$ to digit line $DG_{511}$, a set comprising 2 bytes (for example, digit line $DG_0$ to digit line $DG_{15}$)is constructed at the time of each burst read, and 1 bit at a time is output, sequentially, from the output terminal $TO_0$. Similarly, at the other output terminals $TO_1$~output terminal $TO_7$, a set comprising 2 bytes is constructed from the corresponding digit lines at the time of each burst read, and the data is output 1 bit at a time, in sequence.

The sense amplifier circuit 8 comprises 16 bytes worth (1 page), equivalent to 256 sense amplifiers, and each sense amplifier conducts an evaluation of data stored in the memory cell using the information current input from the Y selector 12, that is the signal $YD_0$~signal $YD_{127}$, and outputs a data signal (data signal $DT_0$~data signal $DT_{127}$) of, for example, level "H" if data is written in the memory cell, or of level "L" if no data is written.

The latch circuit 7 latches the data signal $DT_0$~data signal $DT_{127}$ output from the sense amplifier circuit 8 into two groups, namely, the first latch group and the second latch group, which each comprise 128 latches, using the latch signal SAL0 and the latch signal SAL1.

Furthermore, the latch circuit 7 converts the data from data signal $DT_0$ to data signal $DT_{127}$ stored in the first latch group into a data signal $DTA_0$~data signal $DTA_{127}$ respectively, and the data from data signal $DT_0$ to data signal $DT_{127}$ stored in the second latch group into a data signal $DTB_0$~data signal $DTB_{127}$ respectively, and outputs the data signals to a latch output selector 16.

Based on a control signal CA0B from a latch control circuit 17, the latch output selector 16 outputs either the first latch group output comprising the data signal $DTA_0$~data signal $DTA_{127}$, or the second latch group output comprising the data signal $DTB_0$~data signal $DTB_{127}$, to a page selector 13, as a data signal $DL_0$~data signal $DL_{127}$.

The latch control circuit 17 receives input of the least significant address of the column system, that is, column address signal CA0, from the counter circuit 2U, delays the signal by a predetermined time, and generates the control signal CA0B and the control signal CA0T. Furthermore, the latch control circuit 17 outputs the generated control signal CA0B to the latch output selector 16, and outputs the generated control signal CA0T to the latch circuit 7 and the latch pulse circuit 6.

At this point, in the latch circuit 7, when the control signal CA0T is at a level "L"the first latch group is selected for data retention, whereas when the control signal CA0T is at a level "H" the second latch group is selected for data retention.

The page selector 13, based on the value of a control signal PAGE0~control signal PAGE15 output from the page decoder 18, matches the data signal $DL_0$~data signal $DL_{127}$ output from the latch output selector 16 with the corresponding output terminal $TO_0$~output terminal $TO_7$, and outputs the signal, one bit at a time, to an output buffer circuit 14. For example, focusing on the output terminal $TO_0$, each time the control signal PAGE0~control signal PAGE15 alters through one of the 16 possible variations "0000000000000001", "0000000000000010"~"1000000000000000", "1000000000000000", the data signal $DL_0$~data signal $DL_{15}$ output from the latch output selector 16 is sequentially output from the output terminal $TO_0$. In this description, the most significant (left hand most) bit "1000000000000000" is the control signal PAGE15, and the least significant (right hand most) bit "0000000000000001" is the control signal PAGE0.

The page decoder 18 decodes the page address signal PA0~page address signal PA3 input from the counter circuit 2D, and outputs a control signal PAGE0~control signal PAGE15 to the page selector 13. For example, when the page address signal PA0~page address signal PA3 is set to "0000", "0001"~"1110", "1111", then the control signal PAGE0~control signal PAGE15 is output as "0000000000001", "0000000000000010"~"0100000000000000", "1000000000000000" respectively. In this description the most significant (left hand most) bit of "0000" is the page address signal PA3, and the least significant (right hand most) bit is the page address signal PA0.

Based on the control signal T0 and the control signal T1, the sense amplifier control circuit 19 generates a timing, during the latency period, at which the sense amplifier circuit 8 evaluates the data of the signal $YD_0$~signal $YD_{127}$ input from the Y selector 12, that is, generates a control signal SAEB for controlling the driving of the sense amplifier circuit 8, and then outputs this control signal SAEB to a sense amplifier control pulse selection circuit 23.

At this point, if the control signal SAEB is at level "L" then the sense amplifier circuit 8 is activated (drive state), whereas if the control signal SAEB is at level "H" then the sense amplifier circuit 8 is deactivated (non-drive state)

An ATD circuit 21 delays the carrier signal CR input from the counter circuit 2D by a predetermined preset time, and outputs a control signal TC to a DELAY circuit 22.

The DELAY circuit 22 delays the control signal TC input from the ATD circuit 21 by a plurality of preset times, and outputs a control signal SALC and a control signal SAEC to the sense amplifier control pulse selection circuit 23, in the form of control signals for controlling the operation of the sense amplifier circuit 8 within the cyclic operation period.

The sense amplifier control pulse section circuit 23 outputs a control signal SAE based on the control signal SAL0A and the control signal SAL1A input from the latch pulse selection circuit 19, and the control signal SALC and the control signal SAEC input from the DELAY circuit 22.

The control signal SAE is a control signal for controlling whether the sense amplifier circuit 8 is activated (drive) or deactivated.

Based on the control signal T0 input from the ATD circuit 3, the control signal SALS input from the DELAY circuit 5, and the sense amplifier control pulse selection circuit 23, a BUSY signal generation circuit 20 outputs a READY/BUSY signal from an external pin indicating whether or not the semiconductor memory device is being used by the system, and outputs a control signal BUSYB of identical logic to the sense amplifier control pulse selection circuit 23.

At this point, a level "L" READY/BUSY signal (control signal BUSYB), indicates that the semiconductor memory device is in a BUSY state (a latency state) reading data, and that new access is not possible, whereas a level "H" READY/BUSY signal, indicates that the semiconductor memory device has completed reading data and is in a READY state (cyclic operation state) with new access possible.

Figure 2:
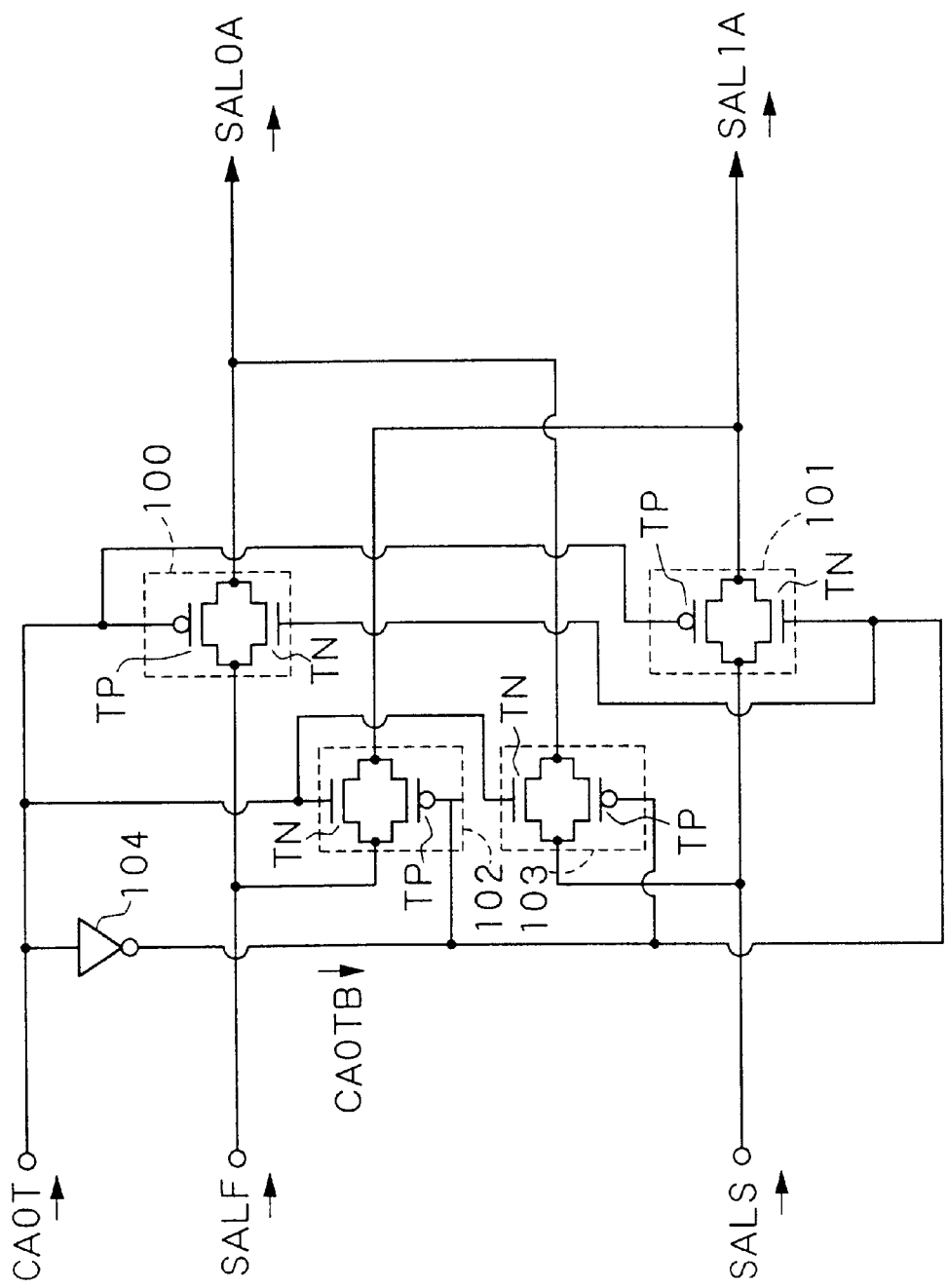
FIG. 2 is a block diagram showing the construction of the latch pulse selection circuit 6 from FIG. 1.

Next is a detailed description of the latch circuit 17 of FIG. 1, with reference to FIG. 2. FIG. 2 is a block diagram showing the construction of the latch pulse selection circuit 6.

Numerals 100 and 101 represent transfer gates, each comprising a p-channel type transistor TP and an n-channel type transistor TN.

Similarly, numerals 102 and 103 also represent transfer gates, each comprising a p-channel type transistor TP and an n-channel type transistor TN.

Numeral 104 represents an inverter, which inverts the signal level of the input control signal CA0T, and then outputs this inverted signal CA0TB to the transfer gates 100~transfer gate 103.

When the control signal CA0T is at level "L", the transfer gate 100 and the transfer gate 101 are switched ON, and the transfer gate 102 and the transfer gate 103 are switched OFF.

That is, the n-channel type transistor TN and the p-channel type transistor TP of the transfer gate 100 and the transfer gate 101 are in an ON state, and the n-channel type transistor TN and the p-channel type transistor TP of the transfer gate 102 and the transfer gate 103 are in an OFF state.

In this state, the latch pulse circuit 6 outputs the control signal SALF as the control signal SAL0A, and outputs the control signal SALS as the control signal SAL1A.

In contrast, when the control signal CA0T is at level "H", the transfer gate 100 and the transfer gate 101 are switched OFF, and the transfer gate 102 and the transfer gate 103 are switched ON.

That is, the n-channel type transistor TN and the p-channel type transistor TP of the transfer gate 100 and the transfer gate 101 are in an OFF state, and the n-channel type transistor TN and the p-channel type transistor TP of the transfer gate 102 and the transfer gate 103 are in an ON state.

In this state, the latch pulse intuit 6 outputs the control signal SALF as the control signal SAL1A, and outputs the control signal SALS as the control signal SAL0A.

Figure 3:
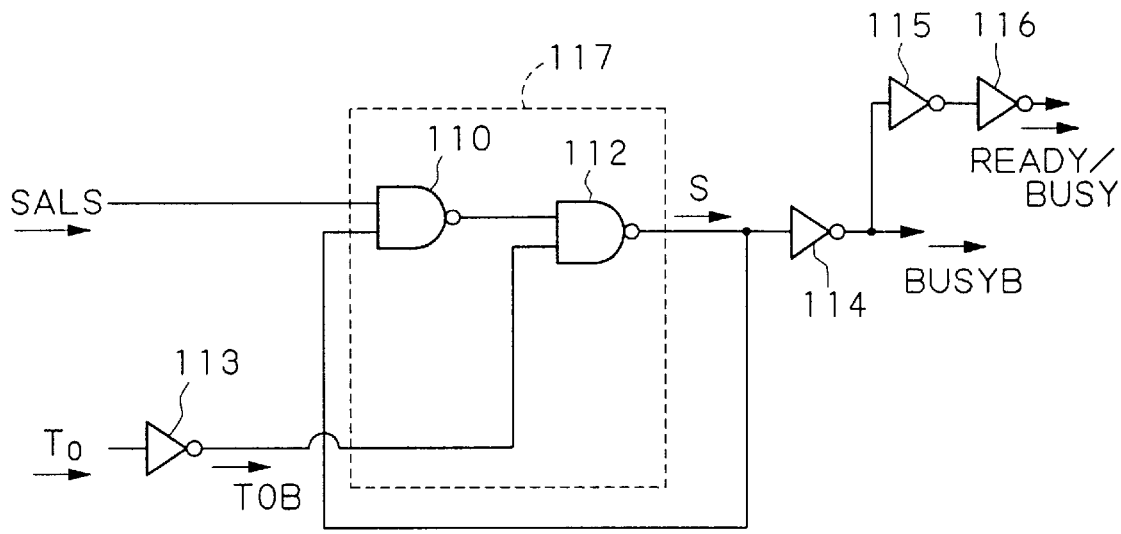
FIG. 3 is a block diagram showing the construction of the BUSY signal generation circuit 20 from FIG. 1.

Next is a detailed description of the BUSY signal generation circuit 20 of FIG. 1, with reference to FIG. 3. FIG. 3 is a block diagram showing the construction of the BUSY signal generation circuit 20.

Numerals 110 and 112 represent NAND circuits which make up a latch 117. Numeral 113 represents an inverter which inverts the polarity of the input control signal T0 and outputs a control signal T0B as a result of the inversion.

The control signal T0 is normally of level "L", and in terms of control level, is output as a pulse of predetermined width.

Furthermore, the control signal SALS is normally of level "H", and in terms of control level, is output as a pulse of predetermined width.

Numeral 114 represents an inverter, which inverts an output signal s from the NAND circuit 112, and outputs the inverted signal as the control signal BUSYB.

Numerals 115 and 116 are also inverters which are connected in series and which perform processing for voltage level adjustment and current amplification of the input control signal BUSYB, and then output the results of the processing, in the form of a control signal READY/BUSY with the same polarity as the control signal BUSYB, from an external terminal to circuits outside the semiconductor memory device.

Then, if the output signal s from the NAND circuit 112 is of level "L", then because the output signal s is connected to the input terminal of the NAND circuit 110, the output from the NAND circuit 110 will be of level T.

At this point, if the control signal T0 rises to level "H" (when a level "H" pulse is input to the input terminal of the NAND circuit 112), the output signal s from the NAND circuit 112 will be of level "H". As a result, the output from the NAND circuit 110 will alter to level "L" because both of the two inputs will be of level "H". Consequently, in the latch 117, the output signal s from the NAND circuit 112 is retained at level "H" by having one of the inputs at level "L".

In contrast, if the output signal s from the NAND circuit 112 is of level "H", then because the output signal s is connected to the input terminal of the NAND circuit 110, the output from the NAND circuit 110 will alter to level "L" because both of the two inputs will be of level "H".

At this point, if the control signal SALS falls to level "L" (when a level "L" pulse is input to the input terminal of the NAND circuit 110), the output signal from the NAND circuit 110 will be of level "H". As a result, the output from the NAND circuit 112 will alter to level "L" because both of the two inputs will be of level "H". Consequently, in the latch 117, by having one of the inputs to the NAND circuit 110 at level "L", the output signal from the NAND circuit 110 is retained at level "L" and the output signal s from the NAND circuit 112 is retained at level "H".

Figure 4:
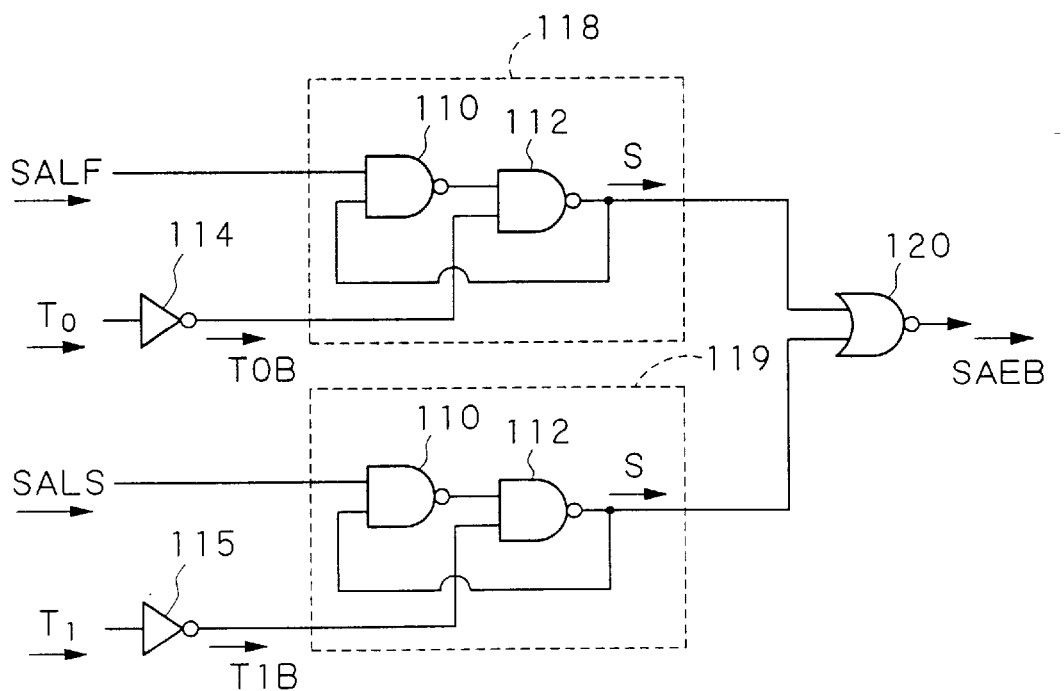
FIG. 4 is a block diagram showing the construction of the sense amplifier control circuit 19 from FIG. 1.

Next is a detailed description of the sense amplifier control circuit 19 of FIG. 1, with reference to FIG. 4. FIG. 4 is a block diagram showing the construction of the sense amplifier control section 19.

A latch 118 and a latch 119 are of identical construction to the latch 117 shown in FIG. 3, and so are not described here.

Furthermore, in terms of operation, the latch 118 is identical with the latch 117 of FIG. 3, with the exception that the control signal SALS input into the latch 117 is switched for a control signal SALF. Similarly, the latch 119 is also identical with the latch 117, with the exception that the control signal T0 from FIG. 3 is replaced with a control signal T1. Other than these exceptions, the operation of the latches is identical, and so the description of the operation is omitted.

Numeral 114 represents an inverter which inverts the input control signal T0, and outputs the inverted signal as a control signal T0B to an input terminal of the NAND circuit 112 of the latch 118.

Numeral 115 represents an inverter which inverts the input control signal T1, and outputs the inverted signal as a control signal T1B to an input terminal of the NAND circuit 112 of the latch 119.

Numeral 120 represents a NOR cit which outputs a control signal SAEB of level "L" if either one of the output from the latch 118 or the output from the latch 119 is of level "H", or alternatively, outputs a control signal SAEB of level "H" if both the output from the latch 118 and the output from the latch 119 are of level "L".

Figure 5:
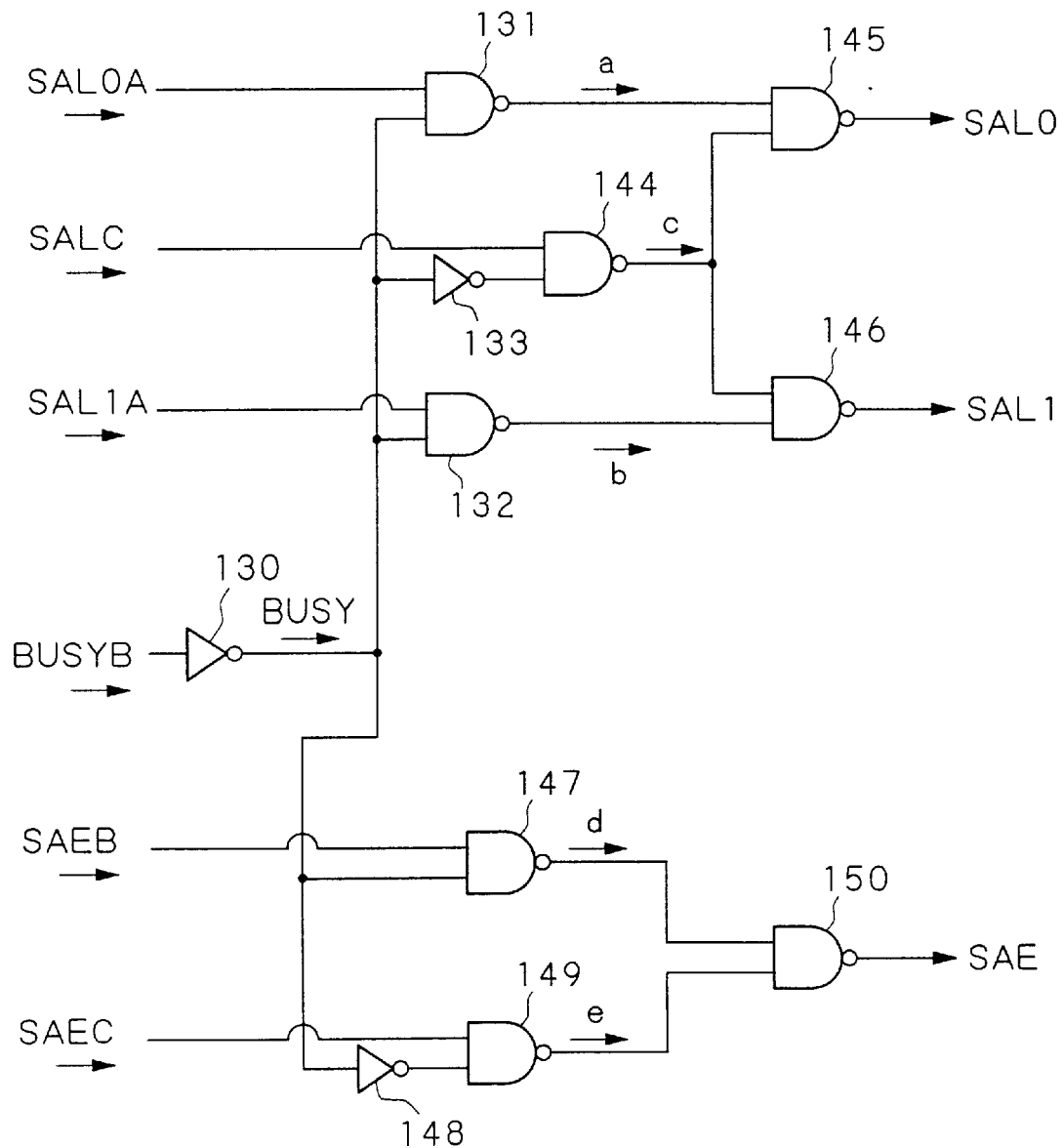
FIG. 5 is a block diagram showing the construction of the sense amplifier control pulse selection circuit 23 from FIG. 1.
Figure 6:
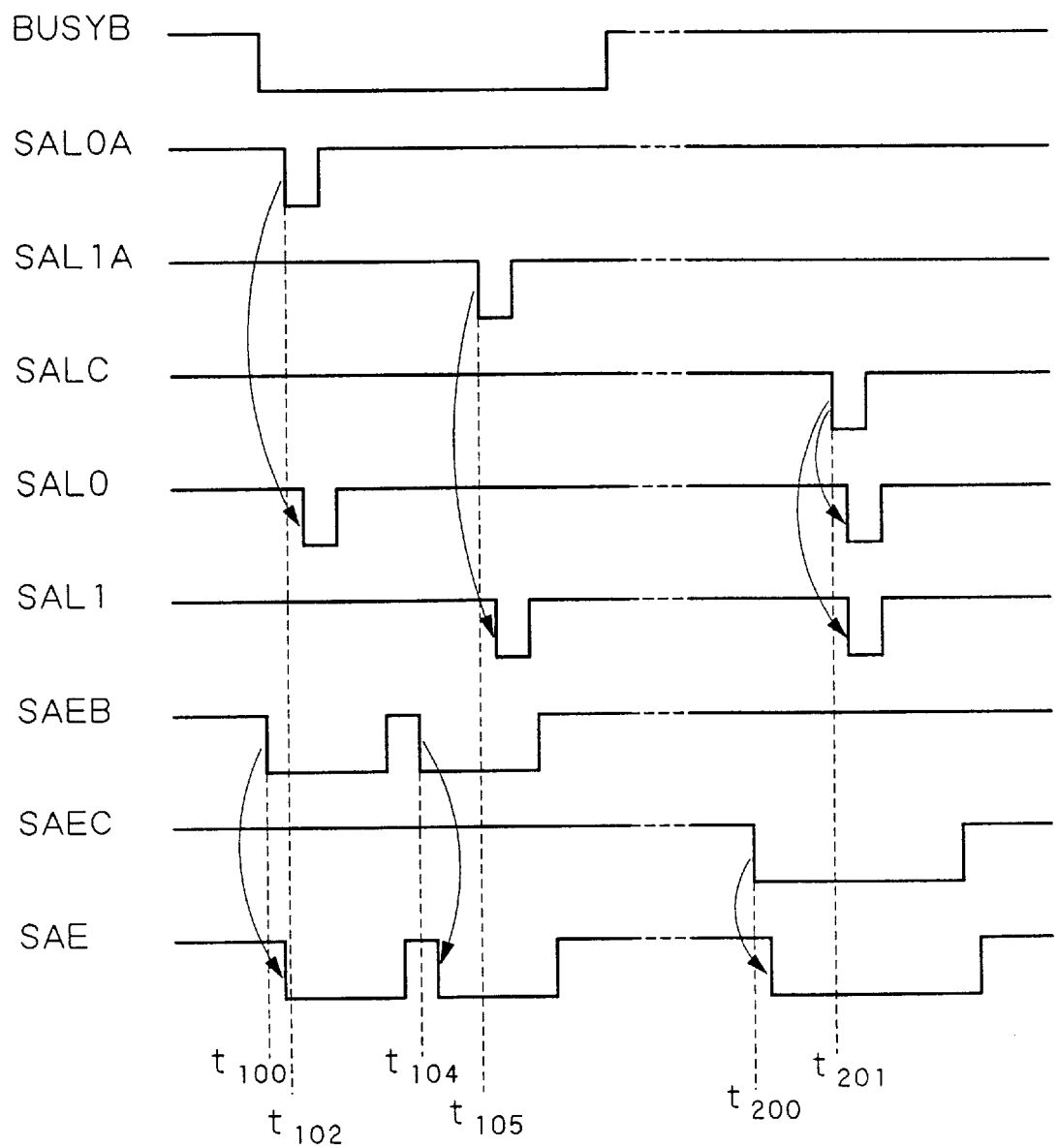
FIG. 6 is a flow chart showing the operation of the sense amplifier control pulse selection circuit 23 of FIG. 5.

Next is a detailed description of the sense amplifier control pulse selection circuit 23 of FIG. 1, with reference to FIG. 5 and FIG. 6. FIG. 5 is a block diagram showing the construction of the sense amplifier control pulse selection circuit 23.

Furthermore, FIG. 6 is a timing chart describing an example of the operation of the sense amplifier control pulse selection circuit 23 of FIG. 5.

When the control signal BUSYB input from the BUSY signal generation circuit 20 is of level "L", the semiconductor memory device is in a latency state, whereas when the control signal BUSYB is of level "H", the semiconductor memory device is in a cyclic operation state.

When the control signal BUSYB is of level a "L", the semiconductor memory device is in a latency state, and the inverter 130 inverts this input control signal BUSYB, and outputs a level "H" control signal BUSY.

Furthermore, in the case of a latency state, the control signal SAL0A and the control signal SAL1A generated by the control signal T0, which are generated as control signals as level "L" pulses, are input from the latch pulse selection circuit 6. That is, because the control signal SAL0A and the control signal SAL1A are normally input at level "H", the output signal a from the NAND circuit 131 and the output signal b from the NAND circuit 132 will be of level "L".

Moreover, because the control signal BUSY is at level "H", the inverter 133 will invert this control signal BUSY, and output a signal of level "L" to an input terminal of the NAND circuit 144. Consequently, the output signal c from the NAND circuit 144 will be of level "H".

As a result, the control signal SAL1 and the control signal SAL1 output from the NAND circuit 145 and the NAND circuit 146 respectively, will be of level "L".

Furthermore, because the control signal SAL0A and the control signal SAL1A are generated in the latch pulse selection circuit 6 based on the control signal SALF and the control signal SALS, the control signal SAL0A and the control signal SAL1A are output as pulses of a predetermined width with the same polarity (level "L") as the control signal SALS and the control signal SALF.

Then, as is shown in FIG. 6, if at a time t102, the control signal SAL0A is input as a level "L" pulse, then the output signal a from the NAND circuit 131 will become level "H" for the duration of the width of the pulse. Consequently, the NAND circuit 145 will output a control signal SAL0 as a level "L" pulse of the same width as the output signal a.

Similarly, as is shown in FIG. 6, if at a time t105, the control signal SAL1A is input as a level "L" pulse, then the output signal b from the NAND circuit 132 will become level "H" for the duration of the width of the pulse. Consequently, the NAND circuit 146 will output a control signal SAL1 as a level "L" pulse of the same width as the output signal b.

Furthermore, when the control signal BUSYB is at level "L", the semiconductor memory device is in a latency state, and the inverter 130 inverts this input control signal BUSYB, and outputs a level "H" control signal BUSY.

As a result of subsequent passage through an inverter 148, a level "L" signal is input into one of the input terminals of a NAND circuit 149, and so regardless of whether the signal level of the control signal SAEC input via the other input terminal is of level "H" or level "L", the output signal e will be output at level "H".

At this point, at a time t100, the control signal SAEB is input as a level "L" pulse, and the NAND circuit 147 outputs the signal d at a level "H" for the same duration as the level "L" pulse of this control signal SAEB. Consequently, the NAND circuit 150 will output the control signal SAE at a level "L" for the period that the signal d is at level "H".

Similarly, at a time t104, the control signal SAEB is input as a level "L" pulse, and the NAND circuit 147 outputs the signal d at a level "H" for the same duration as the level "L" pulse of this control signal SAEB. Consequently, the NAND circuit 150 will output the control signal SAE at a level "L" for the period that the signal d is at level "H".

The reason that the control signal SAE is output consecutively two times during the latency period, is so as to consecutively drive the sense amplifier circuit 8 two times, so that following evaluation, the data which is read from the memory cell 9 via the level "L" pulse control signal SAL1, is written in sequence, with different timings, into the first latch group and the second latch group within the latch circuit 7.

When the control signal BUSYB is at level "H", the semiconductor memory device is in a cyclic operation state, and the inverter 130 inverts this input control signal BUSYB, and outputs a level "L" control signal BUSY.

This results in a level "L" signal being input into one of the input terminals of both the NAND circuit 131 and the NAND circuit 132.

Consequently, because both the NAND circuit 131 and the NAND circuit 132 have a level "L" signal input at one of the input terminals, then regardless of what level of signal is input at the respective other input terminals, the output signal a and the output signal b respectively, will both be output at level "H".

Furthermore, in the case of a cyclic operation period, the control signal SALC generated via the carrier signal CR of the counter circuit 2D, which is generated as a control signal as a level "L" pulse, is input from the DELAY circuit 22.

Moreover, because the control signal BUSY is at level "L", the inverter 133 inverts the input control sisal BUSY, and outputs a level "H" signal to an input terminal of the NAND circuit 144.

Normally, the control signal SALC is input as a level "H" signal and so the output signal c from the NAND circuit 144 will be of level "L".

As a result, the control signal SAL0 and the control signal SAL1 output from the NAND circuit 145 and the NAND circuit 146 respectively, are both of level "H".

Furthermore, the control signal SALC is generated in the DELAY circuit 22 based on the carrier signal CR, and in terms of control signal level, is output as a level "L" pulse of predetermined width.

Then, as is shown in FIG. 6, if at a time t201, the control signal SAL1C is input as a level "L" pulse, then the output signal c from the NAND circuit 144 will become level "H" for the duration of the width of the pulse. Consequently, the NAND circuit 145 and the NAND circuit 146 will output the control signal SAM and the control signal SAL1 respectively, as level "L" pulses of the same width as the output signal c.

In this case, the control signal SAL1 and the control signal SAL1 become level "L" at the same time, and the control signal CA0T output from the latch control circuit 17 is used to control whether latching occurs into the first latch group or the second latch group in the latch circuit 7.

Furthermore, when the control signal BUSYB is of level "L", the semiconductor memory device is in a latency state, and the inverter 130 inverts this input control signal BUSYB, and outputs a level "H" control signal BUSY.

Consequently, because the NAND circuit 147 has a level "L" signal input at one of the input terminals, then regardless of whether the signal level of the control signal SAEB input at the other terminal is level "L" or level "H", the output signal d will be output at level "H".

Furthermore, the inverter 148 inverts the control signal BUSY input at level "L", and outputs an inverted level "L" signal to the NAND circuit 149.

Consequently, a level "H" signal from the inverter 148 is input into one of the terminals of the NAND circuit 149.

At this point, at a time t200, the control signal SAEC is input as a level "L" pulse, and the NAND circuit 149 outputs the signal e at a level "H" for the same duration as the level "L" pulse of this control signal SAEC. Consequently, the NAND circuit 150 will output the control signal SAE at a level "L" for the period that the signal e is at level "H".

In the cyclic operation period, the aforementioned control signal SAE is output as a level "L" pulse at a timing to latch the data read from the memory cell 9 into the corresponding latch group of the latch 7, and is used to drive the sense amplifier circuit 8.

Figure 7:
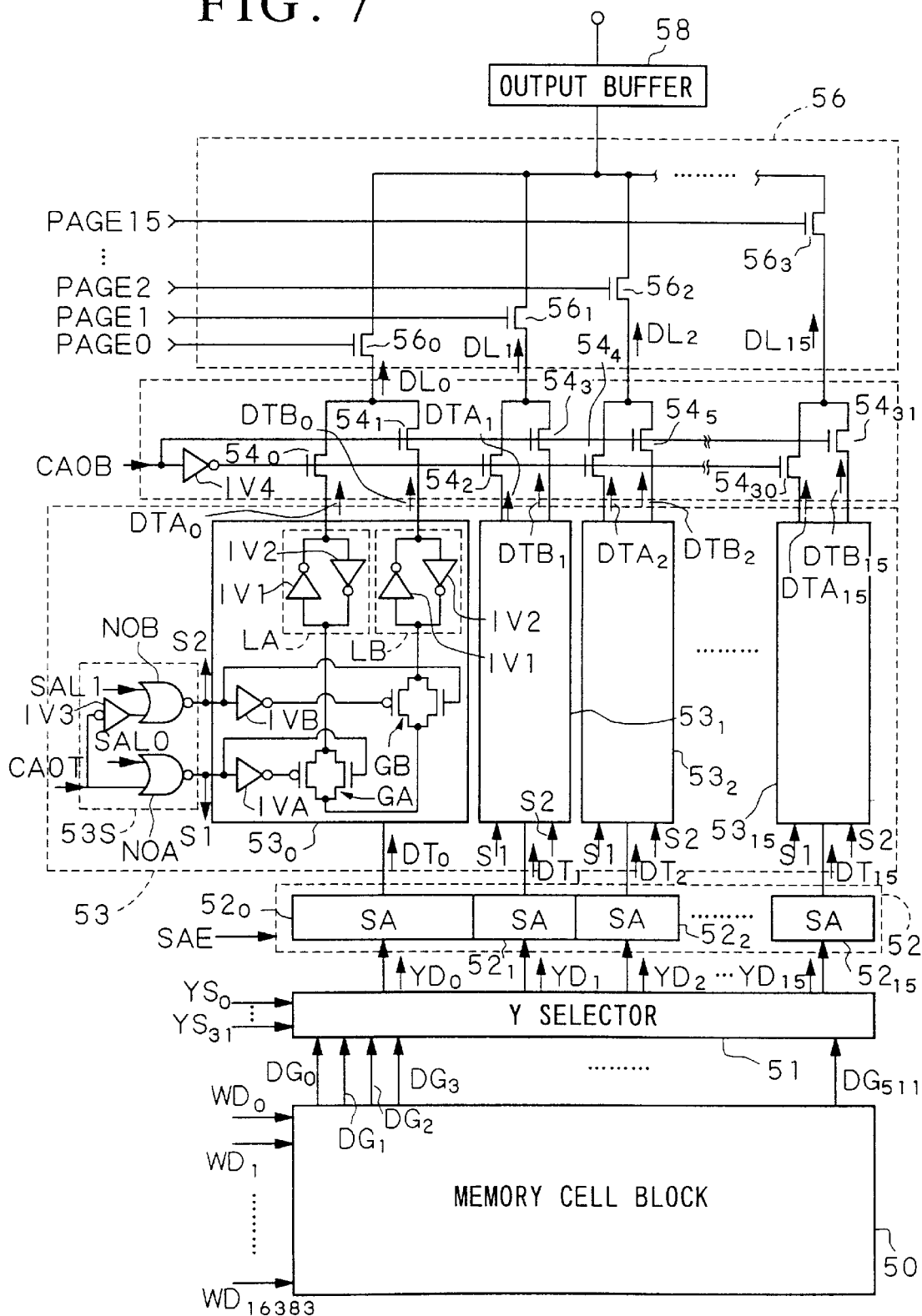
FIG. 7 is a block diagram showing the construction of a section for outputting data stored in a memory cell, from the memory cell to an output terminal $TO_0$ from the output terminals $TO_0$ to output terminal $TO_7$ of FIG. 1

Next is a detailed description of the region T of the semiconductor memory device shown in FIG. 1, with reference to FIG. 7. FIG. 7 is a block diagram showing the construction of the section in the output terminal $TO_0$ to output terminal $TO_7$ shown in FIG. 1, for outputting the data stored in a memory cell, from the memory cell to the output terminal $TO_0$. That is, FIG. 7 is a diagram showing the construction of the one eighth of the region T which corresponds to the output terminal $TO_0$, which performs the output of 1 bit of data from an 8 bit data signal which is output in parallel from the output terminals $TO_0$ to output terminal $TO_7$.

The circuit construction corresponding to the output terminals $TO_1$ to output terminal $TO_7$ is identical with the circuit construction corresponding to the output terminal $TO_0$ shown in FIG. 7 and described below.

A memory cell block 50 represents the one eighth region of the capacity of the memory cell 9 (refer to FIG. 1) which corresponds to the output terminal $TO_0$. Consequently, the memory cell block 50 comprises digit line $DG_0$~digit line $DG_{511}$ as the digit lines connected with the memory cell transistors. Furthermore, the word selection line $WD_0$ to word selection line $WD_{16383}$ are input in the memory cell block 50, and during burst reading, one of these word selection lines is activated, and the memory transistor which is connected through a gate to this word selection line is selected.

A Y selector section 51 represents a one eighth portion of the Y selector 12 construction (refer to FIG. 1). Consequently, the Y selector section 51 incorporates 512 Y switches (transistors) which correspond to each of the digit lines $DG_0$ to digit line $DG_{511}$. A control signal $YS_0$ to control signal $YS_{31}$ is input into the Y selector section 51, and a single control signal YS is connected to 16 Y switches, so that for example, the control signal $YS_0$ controls the Y switches connected to the digit signals $DG_0$ to digit signal $DG_{15}$. At this point, if within the memory cell block 50, the control signal $YS_0$ is activated and shifts to level "H", then the digit signal $DG_0$ to digit signal $DG_{15}$ will output the signal $YD_0$ to signal $YD_{15}$ (the information written in the memory transistors selected by the word selection line) via the Y switches to a sense amplifier 52 as current information.

The sense amplifier section 52 represents a one eighth portion of the sense amplifier circuit 8 construction (refer to FIG. 1), and comprises 16 sense amplifiers labeled sense amplifier $52_0$ to sense amplifier $52_{15}$. These sense amplifiers $52_0$ to sense amplifier $52_{15}$ are circuits typically used in mask ROMs and as such are not described here. The signal YD from the digit line selected by the Y switch is input into the sense amplifier section 52, so that for example, in the case where signal $YS_0$ is selected, the signals from digit line $DG_0$ to digit line $DG_{15}$ are input into each of the sense amplifiers $52_0$ to sense amplifier $52_{15}$ as signals $YD_0$ to signal $YD_{15}$ respectively. From this current information, the sense amplifier section 52, which shifts to a drive (activated) state when the control signal SAE is at level "L", evaluates whether the data stored in the memory cell transistors is a "1" or a "0", and then outputs the evaluation results as a data signal $DT_0$ to data signal $DT_{15}$ respectively.

Furthermore, when the control signal SAE is at level "H", the sense amplifier section 52 shifts to a non-drive (deactivated) state, and is controlled so that a drive current will not flow.

A latch section 53 represents a one eighth portion of the latch circuit 7 construction (refer to FIG. 1), and comprises latch pairs $53_0$ to latch pair $53_{15}$, and control of the latch pairs $53_0$ to latch pair $53_{15}$, is conducted via a control signal S1 and a control signal S2 generated by a control circuit 53S.

Each of the latch pairs $53_0$ to latch pair $53_{15}$ are of identical construction, and only the latch pair $53_0$ has been selected for the following description.

The latch pair $53_0$, comprises a latch LA and a latch LB internally, which latch a data signal $DTA_0$ and a data signal $DTB_0$ respectively, and output these data signals to a latch output selector section 54. A transfer gate GA and a transfer gate GB use the control signal S1 and the control signal S2 to output the data signal $DT_0$ input from the sense amplifier $52_0$ to either the latch LA or the latch LB.

The latch LA and the latch LB are of identical construction, wherein the input terminals of an inverter INV1 and an inverter INV2 are connected to the output terminal of the other inverter.

That is, when the control signal S1 is of level "H", and the control signal S2 is of level "L", the transfer gate GA is turned ON and the transfer gate GB is turned OFF, so that the data signal $DT_0$ is output to latch LA and subsequently stored in latch LA. In contrast, when the control signal S1 is of level "L", and the control signal S2 is of level "H", the transfer gate GA is turned OFF and the transfer gate GB is turned ON, so that the data signal $DT_0$ is output to latch LB and subsequently stored in latch LB.

The transfer gate GA and the transfer gate GB comprise an n-channel type transistor and a p-channel type transistor connected in parallel. In the case of the transfer gate GA, the control signal S1 is input directly to the gate of the n-channel type transistor, and an inverted signal of the control signal S1 which has been inverted by an inverter IVA is input into the gate of the p-channel type transistor. Consequently, when the control signal S1 is of level "H", both the n-channel type transistor and the p-channel type transistor of the transfer gate GA switch to an ON state, and shift to a state of conduction. In contrast, when the control signal S1 is at level "L", both the n-channel type transistor and the p-channel type transistor of the transfer gate GA switch to an OFF state, and become non-conductive.

Moreover, in the case of the transfer gate GB, the control signal S2 is input directly to the gate of the n-channel type transistor, and an inverted signal of the control signal S2 which has been inverted by an inverter IVB is input into the gate of the p-channel type transistor. Consequently, when the control signal S2 is of level "H", both the n-channel type transistor and the p-channel type transistor of the transfer gate GB switch to an ON state, and shift to a state of conduction. In contrast, when the control signal S2 is at level "L", both the n-channel type transistor and the p-channel type transistor of the transfer gate GB switch to an OFF state, and become non-conductive.

As described above, the latch pair $53_0$ comprises a latch LA and a latch LB, and depending on the state of the control signal S1 and the control signal S2, outputs the data signal $DT_0$ from the sense amplifier $52_0$ to either latch LA or latch LB, thereby storing the signal. The latch pairs $53_1$ to latch pair $53_{15}$ are constructed in an identical manner to the latch pair $53_0$, and output a data signal $DTA_1$ and a data signal $DTB_1$ to data signal $DTA_{15}$ and a data signal $DTB_{15}$ respectively to the latch output selector section 54.

The latches LA of the latch pairs $53_0$ to latch pair $53_{15}$ are incorporated within the first latch group of the latch circuit 7 of FIG. 1, and the latches LB of the latch pairs $53_0$ to latch pair $53_{15}$ are incorporated within the second latch group of the latch circuit 7 of FIG. 1.

Furthermore, the latch circuit sections corresponding to the other output terminals $TO_1$ to output terminal $TO_7$ also comprise a latch A and a latch B, and the first latch group of the latch circuit 7 is formed from the latches A of the latch circuit sections corresponding to output terminals $TO_0$ to output terminal $TO_7$, and the second latch group of the latch circuit 7 is formed from the latches B of the latch circuit sections corresponding to output terminals $TO_0$ to output terminal $TO_7$.

Furthermore, the control circuit 53S comprises a NOR circuit NOA into which is input the latch pulse SAL0 and the control signal CA0T, and which outputs the control signal S1, and a NOR circuit NOB into which is input an inverted signal of the control signal CA0T which has been inverted by an inverter IV3, and the latch pulse SAL1, and which outputs the control signal S2. That is, when the control signal CA0T is at level "L", the latch pulse SAL1 is at level "L", and the latch pulse SAL1 is at level "H", the control circuit 53S outputs the control signal S1 at level "H", and outputs the control signal S2 at level "L". In contrast, when the control signal CA0T is at level "H", the latch pulse SAL1 is at level "H", and the latch pulse SAL1 is at level "L", the control circuit 53S outputs the control signal S1 at level "L", and outputs the control signal S2 at level "H".

As follows is a simple description of the operation of the latch circuit section 53, together with the aforementioned latch pulse selection circuit 6.

During a BUSY period (latency), it is necessary to perform two readings of the data signal $DT_0$ to data signal $DT_{15}$ from the sense amplifier circuit section 52, and latch the data into the latch LA and the latch LB of each of the respective latch pairs $53_0$ to latch pair $53_{15}$. Then, the decision of whether the latches LA of the latch pairs $53_0$ to latch pair $53_{15}$ (the first latch group) or the latches LB of the latch pairs $53_0$ to latch pair $53_{15}$ (the second latch group) are used as the latch group for storing the data signal $DT_0$~data signal $DT_{15}$, is controlled by the level of the control signal CA0T which is a delayed signal generated from, the column address signal CA0 which represents the least significant address data of the column address.

At this point, the latch pulse SALF, being generated from the control signal T0, is generated with an earlier timing than the latch pulse SALS generated from the control signal T1 (and is output at level "L"). As a result, the latch pulse SALF is applied to any one latch of latch A and latch B which is made first storing the data signal $DT_0$ to data signal $DT_{15}$.

In a sample circuit of an embodiment of the invention, the circuit is constructed so that when the column address signal CA0 is at level "L" the latch LA is used first, and when the column address signal CA0 is at level "H" the latch LB is used first.

To realize such a construction, the latch pulse selection circuit 6 (FIG. 1) is controlled so that during a latency period when the control signal CA0T is of level "L", the latch pulse SALF is output as a latch pulse LAS1 and the latch pulse SALS is output as the latch pulse SAL1.

Consequently, within the latch pair $53_0$, first a level "H" control signal S1 is output from the control circuit 53S at the timing of the latch pulse SALF, and the latch LA stores the data signal $DT_0$. Then, in order to increment the counter circuit 2U via the control signal T1, the control signal CA0T switches to level "H", and a level "H" control signal S2 is output from the control circuit 53S at the timing of the latch pulse SALS, and the latch LB stores the data signal $DT_0$ from the sense amplifier $52_0$.

Then, during a cyclic operation period, when a control signal REB is input to read data, the rise of the control signal R causes an increment in the counter circuit 2D, and the counter 2D counts up, that is, the enumerated value of the counter 2D transitions from "1111" to "0000". At this point, the output of the selection range data from the page selector 13 (the 16 bytes from PAGE0 to PAGE15), which was stored in the first latch group, is completed.

At this time, an increment is added to the counter 2U via the carrier signal CR output from the counter 2D, the output column address signal CA0 moves to level "L", and the control signal CA0T transitions from level "H" to level "L".

Consequently, the sense amplifier control pulse selection circuit 23 outputs the level "L" one shot pulses of control signal SAL1 and control signal SAL1, based on the control signal SALC.

Then, because the control signal CA0T is at level "L" and the control signal SAL1 is at level "L", the control circuit 53S outputs the control signal S1 at level "H", and outputs the control signal S2 at level "L".

The latch circuit LA then stores the data signal $DT_0$ from the sense amplifier $52_0$ at the timing that the control signal S1 reaches the level "H".

Then, via an identical process to that described above, based on the completion of the reading of the data stored in the second latch group, an increment is added to the counter circuit 2U by the carrier signal CR, which originates from a count being added to the counter 2D as a result of a data read operation, the control signal CA0T moves to level "H", and the control signal S1 is output at level "L", and the control signal S2 output at level "H".

The latch circuit LB then stores the data signal $DT_0$ from the sense amplifier $52_0$ at the timing that the control signal S2 reaches the level "H".

In this manner, each time a control signal REB is input and the counter 2D counts up, the control signal CA0T switches between level "L" and level "H", and the latch group for storing the data from the sense amplifier circuit 8, and the latch group for outputting the data, switches sequentially between the first latch group and the second latch group.

In contrast, the latch pulse selection circuit 6 (FIG. 1) is controlled so that during a latency period when the control signal CA0T is of level "H", the latch pulse SALF is output as a latch pulse LAS1 and the latch pulse SALS is output as the latch pulse SAL0.

Consequently, within the latch pair $53_0$, first a level "H" control signal S2 is output from the control circuit 53S at the timing of the latch pulse SALF, and the latch LB stores the data signal $DT_0$ from the sense amplifier $52_0$. Then, in order to add a count to the counter circuit 2D via the control signal T1, the control signal CA0T switches to level "L", and a level "L" control signal S1 is output from the control circuit 53S, and the latch LA stores the data signal $DT_0$ from the sense amplifier $52_0$ at the timing of the latch pulse SALS.

Then, during a cyclic operation period, when a control signal REB is input to read data, the rise of the control signal R causes an increment in the counter circuit 2D, and the counter 2D counts up.

At this point, the output of the selection range data from the page selector 13, which was stored in the second latch group, is completed.

At this time, an increment is added to the counter 2U via the carrier signal CR output from the counter 2D, the output column address signal CA0 moves to level "H", and the control signal CA0T transitions from level "L" to level "H".

Consequently, the sense amplifier control pulse selection circuit 23 outputs the level "L" pulses of control signal SAL0 and control signal SAL1, based on the control signal SALC.

Then, because the control signal CA0T is at level "H" and the control signal SAL1 is at level "L", the control circuit 53S outputs the control signal S2 at level "H", and outputs the control signal S1 at level "L".

The latch circuit LB then stores the data signal $DT_0$ from the sense amplifier $52_0$ at the timing that the control signal S2 reaches the level "H".

Then, via an identical process to that described above, based on the completion of the reading of the data stored in the first latch group, an increment is added to the counter circuit 2U by the carrier signal CR, which originates from a count being added to the counter 2D as a result of a data read operation, the control signal CA0T moves to level "L", and the control signal S1 is output at level "H", and the control signal S2 output at level "L".

The latch circuit LA then stores the data signal $DT_0$ from the sense amplifier $52_0$ at the timing that the control signal S1 reaches the level "H".

The above operation has already been described in detail with regards to the latch pulse selection circuit 6, using the block diagram of the latch pulse selection circuit 6 of FIG. 5.

In this manner, each time a control signal REB is input and the counter 2D counts up, the control signal CA0T switches between level "L" and level "H", and the latch group for storing the data from the sense amplifier circuit 8, and the latch group for outputting the data, switches sequentially between the first latch group and the second latch group.

The latch output selector section 54 represents a one eighth portion of the latch output selector 16 construction (refer to FIG. 1), and comprises n-channel type transistor $54_0$~channel type transistor $54_{31}$, and an inverter IV4. That is, for the n-channel type transistor $54_0$, the gate thereof is connected to the inverter IV4, the drain thereof is connected to the output of the latch LA of the latch pair $53_0$, and the source thereof is connected to the source of the n-channel type transistor $54_1$. In the case of the n-channel type transistor $54_1$, the control signal CA0B is input into the gate, the drain is connected to the output of the latch LA of the latch pair $53_0$, and the source thereof is connected to the page selector section 56.

Then, when the control signal CA0B is input at level "L", the n-channel type transistor $54_0$ switches to an ON state, and the n-channel type transistor $54_1$ to an OFF state, and so the latch output selector section 54 outputs the data stored in the latch LA of the latch pair $53_0$, as the data signal $DL_0$, to the page selector section 56.

In contrast, when the control signal CA0B is input at level "H", the n-channel type transistor $54_0$ switches to an OFF state, and the n-channel type transistor $54_1$ to an ON state, and so the latch output selector section 54 outputs the data stored in the latch LB of the latch pair $53_0$, as the data signal $DL_0$, to the page selector section 56.

Similarly, depending on the control signal CA0B, the n-channel type transistor $54_2$ and the n-channel type transistor $54_3$ of the latch output selector section control whether the data stored in the latch LA of the latch pair $53_1$, or the data stored in the corresponding latch LB, is output to the page selector section 56; the n-channel type transistor $54_4$ and the n-channel type transistor $54_5$ of the latch output selector section control whether the data stored in the latch LA of the latch pair $53_2$, or the data stored in the corresponding latch LB, is output to the page selector section 56; . . . and the n-channel type transistor $54_{30}$ and the n-channel type transistor $54_{31}$ of the latch output selector section control whether the data stored in the latch LA of the latch pair $53_{15}$, or the data stored in the corresponding latch LB, is output to the page selector section 56.

At this time, when the control signal CA0B is input at level "L", the n-channel type transistor $54_2$, the n-channel type transistor $54_4$, . . . the n-channel type transistor $54_{30}$ switch to an ON state, and the n-channel type transistor $54_3$, the n-channel type transistor $54_5$, . . . the n-channel type transistor $54_{31}$ switch to an OFF state, and so the latch output selector section 54 outputs the data stored in the latches LA of each of the latch pairs $53_1$ to latch pair $53_{15}$, as the data signals $DL_1$, . . . , data signal $DL_{15}$ respectively, to the page selector section 56.

In contrast, when the control signal CA0B is input at level "H", the n-channel type transistor $54_2$, the n-channel type transistor $54_4$, . . . the n-channel type transistor $54_{30}$ switch to an OFF state, and the n-channel type transistor $54_3$, the n-channel type transistor $54_5$, . . . the n-channel type transistor $54_{31}$ switch to an ON state, and so the latch output selector section 54 outputs the data stored in the latches LB of each of the latch pairs $53_1$ to latch pair $53_{15}$, as the data signals $DL_1, \ldots,$ data signal $DL_{15}$ respectively, to the page selector section 56.

Namely, when the control signal CA0B is input at level "L", the latch output selector section 54 outputs the data stored in the latches LA of each of the latch pairs $53_0$ to latch pair $53_1$ (the first latch group of the latch circuit of FIG. 1) to the page selector section 56.

Similarly, when the control signal CA0B is input at level "H", the latch output selector section 54 outputs the data stored in the latches LB of each of the latch pairs $53_0$ to latch pair $53_{15}$ (the second latch group of the latch circuit of FIG. 1) to the page selector section 56.

The page selector section 56 represents a one eighth portion of the page selector 13 construction (refer to FIG. 1), and comprises n-channel type transistor $56_0$ to n-channel type transistor $56_{15}$.

That is, for the n-channel type transistor $56_0$, the control signal PAGE0 is input to the gate thereof, the drain thereof is connected to the source of the n-channel type transistor $54_0$ and the source of the n-channel type transistor $54_1$, and the source thereof is connected to an output buffer 58.

Similarly, in the case of the n-channel type transistor $56_1$, the control signal PAGE1 is input to the gate, the drain is connected to the source of the n-channel type transistor $54_2$ and the source of the n-channel type transistor $54_3$, and the source is connected to the output buffer 58; in the case of the n-channel type transistor $56_2$, the control signal PAGE2 is input to the gate, the drain is connected to the source of the n-channel type transistor $54_4$ and the source of the n-channel type transistor $54_5$, and the source is connected to the output buffer 58; . . . ; and in the case of the n-channel type transistor $56_{15}$, the control signal PAGE15 is input to the gate, the drain is connected to the source of the n-channel type transistor $54_{30}$ and the source of the n-channel type transistor $54_{31}$, and the source is connected to the output buffer 58.

Then, depending on the signal state of the control signal PAGE0 to control signal PAGE15, the page selector section 56 controls which of the data signals $DL_0$ to data signal $DL_{15}$ input from the latch output selector section 54 are output to the output buffer 58.

Thus, when the control signal PAGE0 to control signal PAGE15 is "0000000000000001", the n-channel type transistor $56_0$ switches to an ON state and the n-channel type transistors $56_2$~n-channel type transistor $56_{15}$ switch to an OFF state, and the page selector section 56 outputs the data signal $DL_0$ to the output buffer 58.

Here, the "1" of the least significant bit of 0"0000000000000001" corresponds to the control signal PAGE0 from within the control signal PAGE0 to control signal PAGE15.

In contrast, when the control signal PAGE0~control signal PAGE15 is "1000000000000000", the n-channel type transistors $56_0$~n-channel type transistor $56_{14}$ switch to an OFF state and the n-channel type transistor $56_{15}$ switches to an ON state, and the page selector section 56 outputs the data signal $DL_{15}$ to the output buffer 58.

Here, the "1" of the most significant bit of "1000000000000000" corresponds to the control signal PAGE15 from within the control signal PAGE0 to control signal PAGE15.

The output buffer 58 represents a one eighth portion of the output buffer circuit 14 construction (refer to FIG. 1).

Consequently, the output buffer 58 conducts voltage conversion processing and current amplification processing on the data signals input one bit at a time from the page selector section 56, and outputs the results of this processing from the output terminal $TO_0$.

Figure 8:
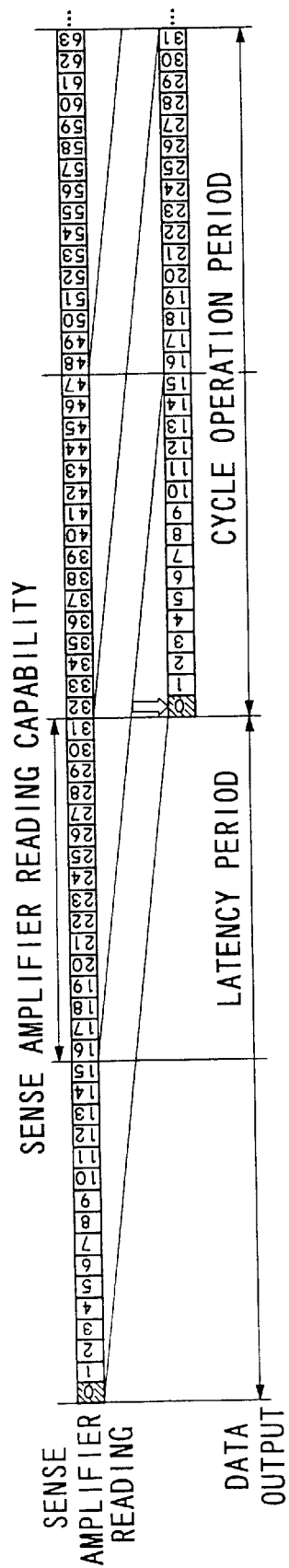
FIG. 8 is a conceptual diagram showing an outline of the data reading/read-out operation of a semiconductor memory device according to an embodiment of the present invention.

With a semiconductor memory device according to the embodiment described above, by providing the latch circuit 7 with a first latch group and a second latch group, then during the latency period shown in FIG. 8, byte "0", to byte "15", and byte "16" to byte "31", for example, are latched into the first latch group and the second latch group respectively.

Consequently, with the semiconductor memory device described above, as shown in FIG. 8, in order to complete the read processing of 32 bytes of data, comprising 16 bytes in each of the first latch group and the second latch group, during the latency period, then even in the case of random access in terms of the address value where, for example, the first latch group does not read data from the first byte "1" but from the fifteenth byte "15", there is still the time available while the data of byte "16"~byte "31" stored in the second latch group is output from the output terminal, which is sufficient time to enable reading of the next data from byte "32"~byte "47" into the first latch group and maintenance of the evaluation time of the sense amplifier data in the sense amplifier circuit 8. As a result, the problem observed in conventional examples, wherein data evaluation cannot be conducted because of a lack of sense amplifier evaluation time, does not arise, and continuous data output is possible, thereby enabling an improvement in access times.

FIG. 8 is a conceptual diagram showing an outline of the data read-in/read-out operation of a semiconductor memory device of the present invention.

Furthermore, in the semiconductor memory device described above, because the latch circuit 7 is divided into a first latch group and a second latch group (or the two groups are provided independently) with the two groups outputting stored data from the output terminal alternately, then while the data stored in one of the latch groups is being read, the next set of data is being stored in the other latch group from the sense amplifier circuit 8, and so the sense amplifier data evaluation time can be ensured, and a construction is possible where the digit line from the memory cell 9 is selected by the selector circuit 12 and an information current is supplied to the sense amplifier circuit 8. Consequently, the number of sense amplifiers required for performing evaluation of the data which is read to the digit lines from the memory transistors is able to be reduced.

Consequently, according to the semiconductor memory device described above, the chip surface area is able to be reduced by an area equivalent to the reduction in the number of sense amplifiers, which enables a reduction in production costs.

Moreover, because the number of sense amplifiers is reduced in the semiconductor memory device described above, the drive current required to drive the sense amplifiers can be reduced, enabling a reduction in power consumption, and furthermore, because the sense amplifier drive period is limited to the period during which data is being stored in the latch circuit 7, a further reduction in power consumption is possible.

As a result, the semiconductor memory device described above enables a significant reduction in power consumption, which in the case of use within a portable information apparatus, equates to an extension in the operating time of the portable information apparatus.

In addition, during busy periods, the semiconductor memory device described above detects whether the first latch group and the second latch group of the latch circuit 7 have completed data reading, and in those cases where data reading is detected as having been completed, outputs a signal BUSY to external circuits or external apparatus, and consequently, the external circuits or external apparatus are able to alter, and for example shorten, the random access times, in accordance with the access times of the semiconductor memory device.

As follows is a description of an operational example of the embodiment of the present invention in the case where the control signal CA0T is at level "L", with reference to FIG. 1, FIG. 7, FIG. 9 and FIG. 10, wherein the least significant address data of a column address in an address signal set from externally is at level "L", namely, wherein the value of the internal address signal A0 to internal address signal A3 preset in the counter circuit 2D is "0000", so that output occurs in sequence from PAGE0.

Figure 9:
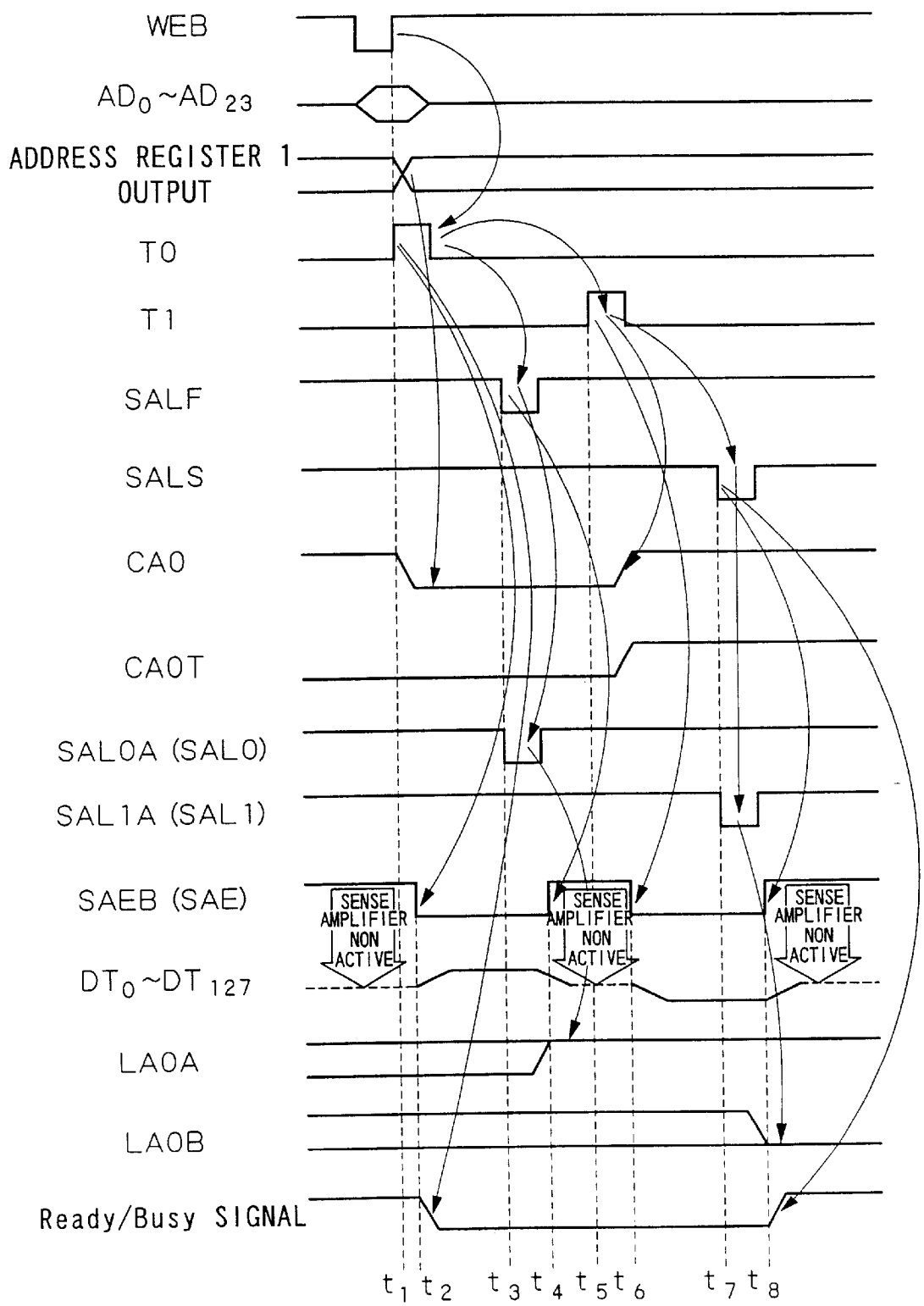
FIG. 9 is a flow chart showing an operational example of a semiconductor memory device according to an embodiment of the present invention.

FIG. 9 is a flow chart showing an operational example, during a latency period, of a semiconductor memory device according to the embodiment, for the case where the control signal CA0T is at level "L".

Figure 10:
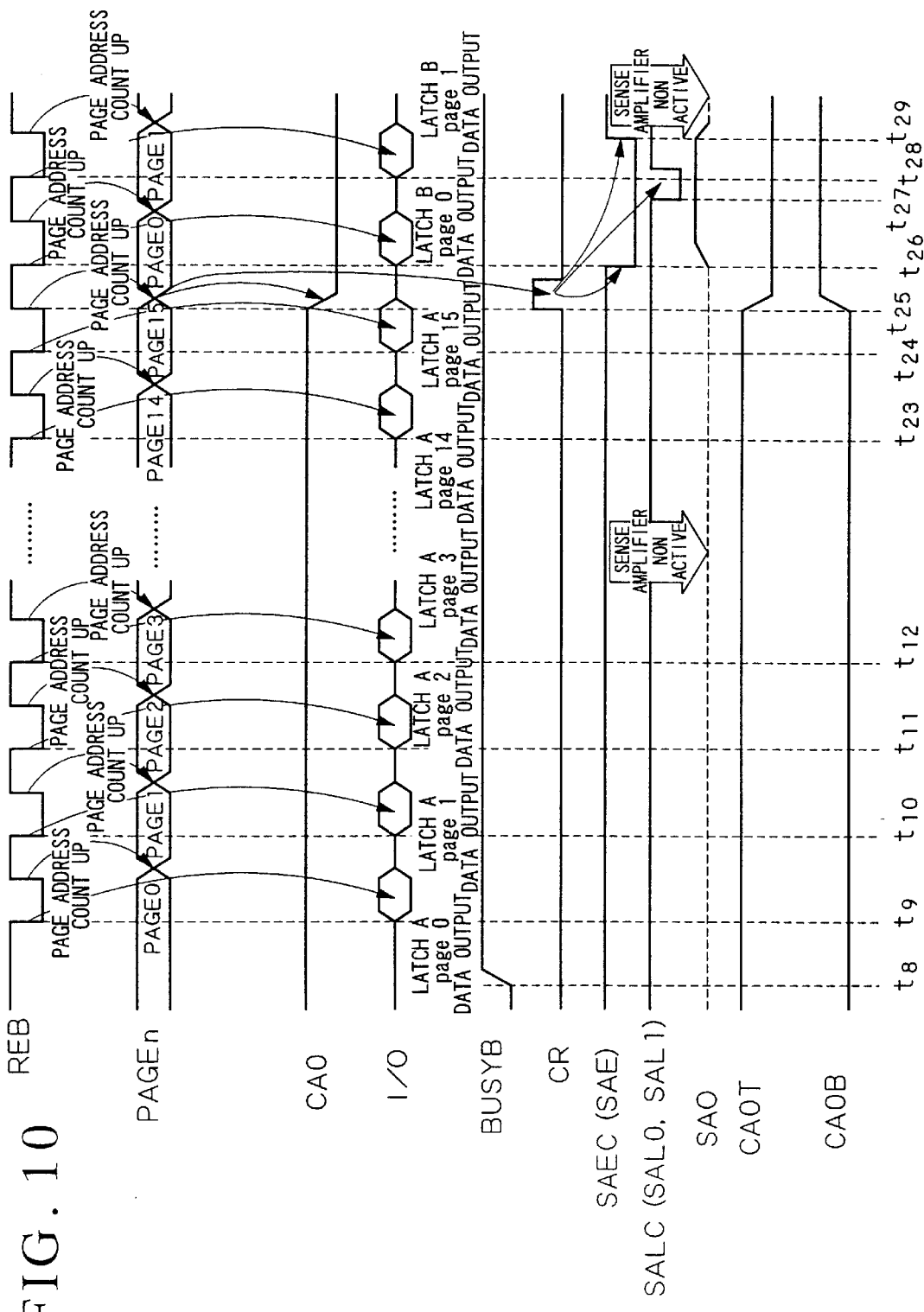
FIG. 10 is a flow chart showing an operational example of a semiconductor memory device according to an embodiment of the present invention.

FIG. 10 is a flow chart showing an operational example, during a cyclic operation period, of a semiconductor memory device according to the embodiment, for the case where the control signal CA0T is at level "L".

At a time t1 in a latency period (the period shown in FIG. 9), at a timing marked by the rising of a control signal WEB from level "L" to level "H", the address signal $AD_0$ to address signal $AD_{23}$ input via the input terminal of the address register 1 is stored in the address register 1.

As a result, the address register 1 outputs the internal address signal A0 to internal address signal A3 to the counter circuit 2D, outputs the internal address signal A4 to internal address signal A13 to the counter circuit 2U, and outputs the row address signal RA5 to row address signal RA14 to the row decoder circuit 10.

Furthermore, the ATD circuit 3 detects any pulse variation in the control signal WEB, and as a result of the detection outputs a one shot pulse control signal T0 at level "H".

Then, at a timing marked by this shift of the control signal T0 to level "H", the counter circuit 2D and the counter circuit 2U take in the address signal $AD_0$~address signal $AD_3$ and the address signal $AD_4$~address signal $AD_{13}$ respectively, input from the address register 1, as initial setting values (starting read address values).

Next, at a time t2, the sense amplifier control circuit 19 causes the control signal SAEB to transition from level "H" to level "L" at a timing marked by the rise of the control signal T0.

At this point, the column decoder circuit 11 switches the Y selector 12 in accordance with the column address signal CA0~coulm address signal CA4 input from the counter circuit 2U, and outputs the data signal $YD_0$, data signal $YD_1$, . . . , data signal Y to the corresponding sense amplifiers of the sense amplifier circuit 8.

Consequently, a drive current flows through the sense amplifier circuit 8 which is then activated, readout from the memory cell 9 is performed via the word selection line from within the word selection line $WD_0$~word selection line $WD_{163383}$ output from the row decoder circuit 10, and a data evaluation of the data signal $YD_0$ to data signal $YD_{127}$ selected by the control signal $YS_0$ to control signal $YS_{31}$ input from the column decoder circuit 11 is performed, that is an evaluation of whether the data is a "0" or a "1".

Then, as a result of the above evaluation, the sense amplifier circuit 8 outputs the data signal $DT_0$, . . . , data signal $DT_{127}$ corresponding to each of the data signals $YD_0$~data signal $YD_{127}$. In FIG. 9 (and also in FIG. 10~FIG. 12 described below), the output of the data signal $DT_0$~data signal $DT_{127}$ from the sense amplifier circuit 8 is shown as a dotted line for those portions where the output is deactivated and of an undefined status, and as a solid line for those portions where the output is activated, and evaluated data is being output.

At this time, the BUSY signal generation circuit 20 causes the control signal BUSYB and the control signal READY/BUSY to transition from level "L", to level "L" at a timing marked by the rise of the control signal T0, thereby displaying the status as "currently reading data".

Next, at a time t3, the DELAY circuit 5 delays the control signal T0 and outputs a control signal SALF.

At this point, because the column address signal CA0 of the column system address output by the counter circuit 2U, that is, the signal CA0T output by the latch control circuit 17, is of level "L", the latch pulse selection circuit 6 outputs the control signal SAL0A as a level "L" pulse, synchronously with the timing of the output of the level "L" pulse control signal SALF.

Then, because it is within a latency period, the sense amplifier control pulse selection circuit 23 generates a control signal SAL0 from the control signal SAL0A, and outputs the control signal SAL0 to the latch circuit 7.

As a result, the control circuit 53S outputs a one shot pulse control signal S1 at level "H".

Then, using this level "H" control signal S1, the latch circuit 7 stores the data signal $DT_0$~data signal $DT_{127}$ input from the sense amplifier circuit 8 in the first latch group.

Consequently, the first latch group outputs the data signal $DTA_0$, the data signal $DTA_1$, . . . , the data signal $DTA_{127}$ from each of the latches LA Next, at a time t4, the sense amplifier control circuit 19 raises the control signal SAEB from level "L" to level "H" at a timing marked by the fall of the control signal SALF generated by the DELAY circuit 5 from level "H" to level "L".

As a result, the sense amplifier control pulse selection circuit 23 raises the control signal SAE from level "L" to level "H".

Consequently, a drive current stops flowing through the sense amplifier circuit 8 which transitions to a deactivated state, and the output signal shifts to an undefined state.

Next, at a time t5, the DELAY circuit 5 outputs the control signal T1 as a level "H" one shot pulse generated by delaying the control signal T0 by a predetermined time delay.

Then, the counter circuit 2U uses the input of the control signal T1 to add "1" to the enumerated value. As a result, the counter circuit 2D outputs the column address signal CA0, which is the least significant address data from the column system, as a level "H" signal.

As a result, the latch control circuit 17 uses the rising of the column address signal CA0 to level "H" to raise the control signal CA0T from level "L" to level "H".

At this point, because the input column address signal CA0~column address signal CA4 alters (the address is incremented by one), the column decoder circuit 11 switches the Y selector 12, and the next data signal $YD_0$, data signal $YD_1$, . . . , data signal $YD_{127}$ are output to the corresponding sense amplifiers of the sense amplifier circuit 8.

Next, at a time t6, the sense amplifier control circuit 19 lowers the control signal SAEB from level "H" to level "L", at a timing marked by the rise of the control signal T1 from level "L" to level "H".

Consequently, the sense amplifier control pulse selection circuit 23 lowers the control signal SAE from level "H" to level "L".

Then, with the input of a level "L" control signal SAE, a drive current flows through the sense amplifier circuit 8 which switches to an activated state.

As a result, the sense amplifier circuit 8 uses the sense amplifiers to evaluate the data signal $YD_0$ to data signal $YD_{127}$ input from the Y selector 12, and then outputs the results of the evaluation to the latch circuit 7 as the data signal $DT_0$, the data signal $DT_1$, ..., and the data signal $DT_{127}$.

Next, at a time t7, the DELAY circuit 5 outputs the control signal SALS as a level "L" one shot pulse generated by delaying the control signal T1 by a predetermined time delay.

At this point, because the column address signal CA0 of the column system address output by the counter circuit 2U, that is, the signal CA0T output by the latch control circuit 17, is of level "L" the latch pulse selection circuit 6 outputs the control signal SAL1A as a level "L" pulse, synchronously with the timing of the output of the level "L" pulse control signal SALS.

Then, because it is within a latency period, the sense amplifier control pulse selection circuit 23 generates a level "L" control signal SAL1 from the control signal SAL1A, and outputs this control signal SAL1 to the latch circuit 7.

As a result, the control circuit 53S outputs a one shot pulse control signal S2 at level "H".

Then, using this level "H" control signal S2, the latch circuit 7 stores the data signal $DT_0$~data signal $DT_{127}$ input from the sense amplifier circuit 8 in the second latch group.

Consequently, the second latch group outputs the data signal $DTB_0$, the data signal $DTB_1$, ..., the data signal $DTB_{127}$ from each of the latches LB.

Next, at a time t8, the sense amplifier control circuit 19 raises the control signal SAEB from level "L" to level "H" at a timing marked by the fall of the control signal SALS generated by the DELAY circuit 5 from level "H" to level "L".

As a result, the sense amplifier control pulse selection circuit 23 raises the control signal SAE from level "L" to level "H".

Consequently, a drive current stops flowing through the sense amplifier circuit 8 which transitions to a deactivated state, and the output signal shifts to an unstable state.

At this point, the BUSY signal generation circuit 20 raises the control signal READY/BUSY and the control signal BUSYB from level "L" to level "H" at a timing marked by the filing of the control signal SALS from level "H" to level "L".

Then, the state of the semiconductor memory device transitions from a latency period to a cyclic operation period.

Furthermore, on detection of the rise to level "H" of the control signal READY/BUSY output to an external output terminal (output pin), external apparatus (not shown in the figures, but including apparatus such as microprocessors) utilizing the semiconductor memory device begin read operations.

Next, at a time t9, the external apparatus inputs a control signal REB as a level "L" one shot pulse, into the external input pins of the semiconductor memory device in order to begin reading data.

At this point, because the control signal CA0B generated by inversion of the control signal CA0T is at level "L" (the control signal CA0T is at level "H"), the latch output selector 10 outputs the data signal $DTA_0$ to data signal $DTA_{127}$ stored in the first latch group to the page selector 13 as the respective signals data signal $DL_0$, data signal $DL_1$, ..., data signal $DL_{127}$.

Then, the page selector 13 outputs 1 byte data corresponding to the page address signal PA0 to page address signal PA3 output by the counter circuit 2D.

Namely, the counter cit 2D is initially in a state where the page address signal PA0 to page address signal PA3 is "0000", and so the control signal PAGE0 to control signal PAGE15 output by the page decoder 18 will be "0000000000000001".

Consequently, the page selector 13 will output the data signal $DL_0$, the data signal $DL_8$, the data signal $DL_{16}$, ..., and the data signal $DL_{120}$ to the output buffer circuit 14 as the data signal $D_0$, the data signal $D_1$, the data signal $D_2$, ..., and the data signal $D_7$ respectively.

Then, the output buffer circuit 14 will output the data signal $D_0$, the data signal $D_1$, the data signal $D_2$, ..., and the data signal $D_7$ (1 page worth of data, PAGE 0) from the output terminals (external output pins) $TO_0$ to output terminal $TO_7$.

Furthermore, an increment is added to the counter circuit 2D with the rising edge of the control signal REB from level "L" to level "H". As a result, the counter circuit 2D will output the page address signal PA0 to page address signal PA3 as "0001".

Next, at a time t10, in order to read the next data, the external apparatus not shown in the figures, inputs a second level "L" one shot pulse control signal REB into the external input pins of the semiconductor memory device.

At this point, because the control signal CA0B generated by inversion of the control signal CA0T is at level "L", the latch output selector 10 outputs the data signal $DTA_0$ to data signal $DTA_{127}$ stored in the first latch group to the page selector 13 as the respective signals data signal $DL_0$, data signal $DL_1$, ..., data signal $DL_{127}$.

Then, the page selector 13 outputs 1 byte data corresponding to the page address signal PA0 to page address signal PA3 "0001" output by the counter circuit 2D.

As a result, the control signal PAGE0~control signal PAGE15 output by the page decoder 18 will become "0000000000000010".

Consequently, the page selector 13 will output the data signal $DL_1$, the data signal $DL_9$, the data signal $DL_{17}$, ..., and the data signal $DL_{121}$ to the output buffer circuit 14 as the data signal $D_0$, the data signal $D_1$, the data signal $D_2$, ..., and the data signal $D_7$ respectively.

Then, the output buffer circuit 14 will output the data signal $D_0$, the data signal $D_1$, the data signal $D_2$, ..., and the data signal $D_7$ (1 page worth of data, PAGE1) from the output terminals (external output pins) $TO_0$~output terminal $TO_7$.

Furthermore, an increment is added to the counter circuit 2D with the rising edge of the control signal REB from level "L" to level "H". As a result, the counter circuit 2D will output the page address signal PA0~page address signal PA3 as "0010".

The operations described above at the time t9 and the time t10 are repeated at time t11 time t23, and at these times the output buffer circuit 14 data will output the data for PAGE2 to PAGE14 respectively, from the output terminals (external output pins) $TO_0$ to output terminal $TO_7$, as the data signal $D_0$, the data signal $D_1$, the data signal $D_2$, ..., and the data signal $D_7$ respectively Next, at a time $t_{24}$, in order to read the next data, the external apparatus not shown in the figures, inputs another level "L" one shot pulse control signal REB into the external input pins of the semiconductor memory device.

At this point, because the control signal CA0B generated by inversion of the control signal CA0T is at level "L", the latch output selector 10 outputs the data signal $DTA_0$ to data signal $DTA_{127}$ stored in the first latch group to the page selector 13 as the respective signals data signal $DL_0$, data signal $DL_1$, ..., data signal $DL_{127}$.

Then, the page selector 13 outputs 1 byte data corresponding to the page address signal PA0 to page address signal PA3 "1111" output by the counter circuit 2D.

As a result, the control signal PAGE0 to control signal PAGE15 output by the page decoder 18 will become "1000000000000000".

Consequently, the page selector 13 will output the data signal $DL_7$, the data signal $DL_{15}$, the data signal $DL_{23}$, ..., and the data signal $DL_{127}$ to the output buffer circuit 14 as the data signal $D_0$, the data signal $D_1$, the data signal $D_2$, ..., and the data signal $D_7$ respectively.

Then, the output buffer circuit 14 will output the data signal $D_0$, the data signal $D_1$, the data signal $D_2$, ..., and the data signal $D_7$ (1 page worth of data, PAGE15) from the output terminal $TO_0$ to output terminal $TO_7$.

Next, at a time t25, an increment is added to the counter circuit 2D with the rising edge of the control signal REB from level "L", to level "H". As a result, the counter circuit 2D will output the page address signal PA0 to page address signal PA3 as "0000".

At this point, the page address signal PA0 to page address signal PA3 switches from "1111" to "0000", and at the time of this count, the counter circuit 2D outputs the carrier signal CR as a level "H" one shot pulse.

As a result, an increment is added to the address value of the counter circuit 2U, and the column address signal CA0, which is the least significant bit from the column system, transitions from level "H" to level "L".

At this point, the latch control circuit 17 causes the control signal CA0T to transition from level "H" to level "L", and the control signal CA0B to transition from level "L" to level "H".

Then, the latch output selector 10 switches from the first latch group, and outputs the data signal $DTB_0$ to data signal $DTB_{127}$ stored in the second latch group, as the data signal $DL_0$, the data signal $DL_1$, ..., and the data signal $DL_{127}$ respectively, to the page selector 13.

Next, at a time t26, the DELAY circuit 22 generates the control signal SAEC, as a level "L" one shot pulse of a predetermined width (from time t26~time t29), from the carrier signal CR.

Then, in order to transition the sense amplifier circuit 8 from a deactivated state to an activated state, the sense amplifier control pulse selection circuit 23 generates the control signal SAE from the control signal SAEC, and then outputs the control signal SAE to the sense amplifier circuit 8.

At this time, the column decoder circuit 11 generates the control signal $YD_0$~control signal $YD_{31}$ based on the incremented and altered column register signal CA0~column address signal CA4, and outputs the generated signal to the Y selector 12.

Then, based on the control signal $YS_0$~control signal $YS_{31}$, the Y selector 12 selects the data signal $DG_0$~data signal $DG_{4095}$ read from the memory cell 9 and outputs the result to the sense amplifier circuit 8 as the data signal $YD_0$~data signal $YD_{127}$.

Consequently, a drive current flows through the sense amplifier circuit 8 which becomes activated, and so an evaluation of the data signal $YD_0$~data signal $YD_{127}$ input from the Y selector 12 is performed, and as a result the data signal $DT_0$, the data signal $DT_1$, ..., and the data signal $DT_{127}$ respectively are output to the latch circuit 7.

Furthermore, at this point, because the control signal CA0B generated by inversion of the control signal CA0T is at level "H", the latch output selector 10 outputs the data signal $DTB_0$ to data signal $DTB_127$ stored in the second latch group to the page selector 13 as the respective signals data signal $DL_0$, data signal $DL_1$, ..., data signal $DL_{127}$.

Then, the page selector 13 outputs 1 byte data corresponding to the page address signal PA0 to page address signal PA3 "0000" output by the counter circuit 2D.

As a result, the control signal PAGE0 to control signal PAGE15 output by the page decoder 18 will become "0000000000000001".

Consequently, the page selector 13 will output the data signal $DL_0$, the data signal $DL_8$, the data signal $DL_{16}$, ..., and the data signal $DL_{120}$ to the output buffer circuit 14 as the data signal $D_0$, the data signal $D_1$, the data signal $D_2$, ..., and the data signal $D_7$ respectively.

Then, the output buffer circuit 14 will output the data signal $D_0$, the data signal $D_1$, the data signal $D_2$, ..., and the data signal $D_7$ (1 page worth of data, PAGE0) from the output terminals (external output pins) $TO_0$~output terminal $TO_7$.

Next, at a time t27, based on the carrier signal CR, the DELAY circuit 22 applies a predetermined time delay to the control signal TC obtained from the ATD circuit 21, and outputs the control signal SALC, as a level "L" one shot pulse, to the sense amplifier control pulse selection circuit 23.

At this point, the column address signal CA0 of the column system address output from the counter circuit 2U, namely, the control signal CA0T output by the latch control circuit 17, is at level "L".

Then, because it is within a cyclic operation period, the sense amplifier control pulse selection circuit 23 generates a level "L" one shot pulse control signal SAL0 from the control signal SALC, and outputs the control signal SAL0 to the latch circuit 7.

As a result, the control signal CA0T is at level "L", and the control circuit 53S outputs a one shot pulse control signal S1 at level "H".

Then, using this level "H" control signal S1, the latch circuit 7 stores the data signal $DT_0$ to data signal $DT_{127}$ input from the sense amplifier circuit 8 in the first latch group.

Consequently, the first latch group outputs the data signal $DTA_0$, the data signal $DTA_1$, ..., the data signal $DTA_{127}$ from each of the latches LA Next, at a time t28, in order to read the data, the external apparatus not shown in the figures, inputs a level "L" one shot pulse control signal REB into the external input pins of the semiconductor memory device.

At this point, because the control signal CA0B generated by inversion of the control signal CA0T is at level "H", the latch output selector 10 outputs the data signal $DTB_0$ to data signal $DTB_{127}$ stored in the second latch group to the page selector 13 as the respective signals data signal $DL_0$, data signal $DL_1$, ..., data signal $DL_{127}$.

Then, the page selector 13 outputs 1 byte data corresponding to the page address signal PA0 to page address signal PA3 output by the counter circuit 2D.

Namely, the counter circuit 2D is initially in a state where the page address signal PA0~page address signal PA3 is "0001", and so the control signal PAGE0 to control signal PAGE15 output by the page decoder 18 will be "0000000000000010".

Consequently, the page selector 13 will output the data signal $DL_1$, the data signal $DL_9$, the data signal $DL_{17}$, ..., and the data signal $DL_{121}$ to the output buffer circuit 14 as the data signal $D_0$, the data signal $D_1$, the data signal $D_2$, ..., and the data signal $D_7$ respectively.

Next, at a time t29, in order to make the DELAY control circuit 22 transition the control signal SAEC from level "L" to level "H", the sense amplifier control pulse selection circuit 23 raises the control signal SAE from level "L" to level "H".

Consequently, a drive current stops flowing through the sense amplifier circuit 8 which transitions from an activated state to a deactivated state.

Subsequent operations differ only in whether the control signal CA0T is at level "L" or level "H", and in variations in the latch group selected. Because the actual operations are merely a repeat of those described above for the time t8~time t29, further description is omitted.

In this manner, in a semiconductor memory device of the present invention, because the latch circuit 7 is provided with a first latch group and a second latch group, with the two groups outputting stored data from the output terminal alternately, then while the data stored in one of the latch groups is being read, the next set of data is being stored in the other latch group from the sense amplifier circuit 8, and so the sense amplifier data evaluation time can be ensured, and a construction is possible where the digit line from the memory cell 9 is selected by the selector circuit 12 and an information current is supplied to the sense amplifier circuit 8. Consequently, the number of sense amplifiers in the sense amplifier circuit 8 required for performing evaluation of the data, which is read to the digit lines from the memory transistors in the memory cell 9, is able to be reduced.

Consequently, according to the semiconductor memory device described above, the chip surface area is able to be reduced by an area equivalent to the reduction in the number of sense amplifiers, which enables a reduction in production costs.

As follows is a description of an operational example of the embodiment of the present invention, with reference to FIG. 1, FIG. 7, FIG. 11 and FIG. 12, in the case where the operation begins from the situation of the control signal CA0T at level "H" and wherein the least significant address data of a column address in an address signal set from externally is at level "L", namely, wherein the value of the internal address signal A0 to internal address signal A3 preset in the counter circuit 2D is "1111", so that output occurs from PAGE15.

Figure 11:
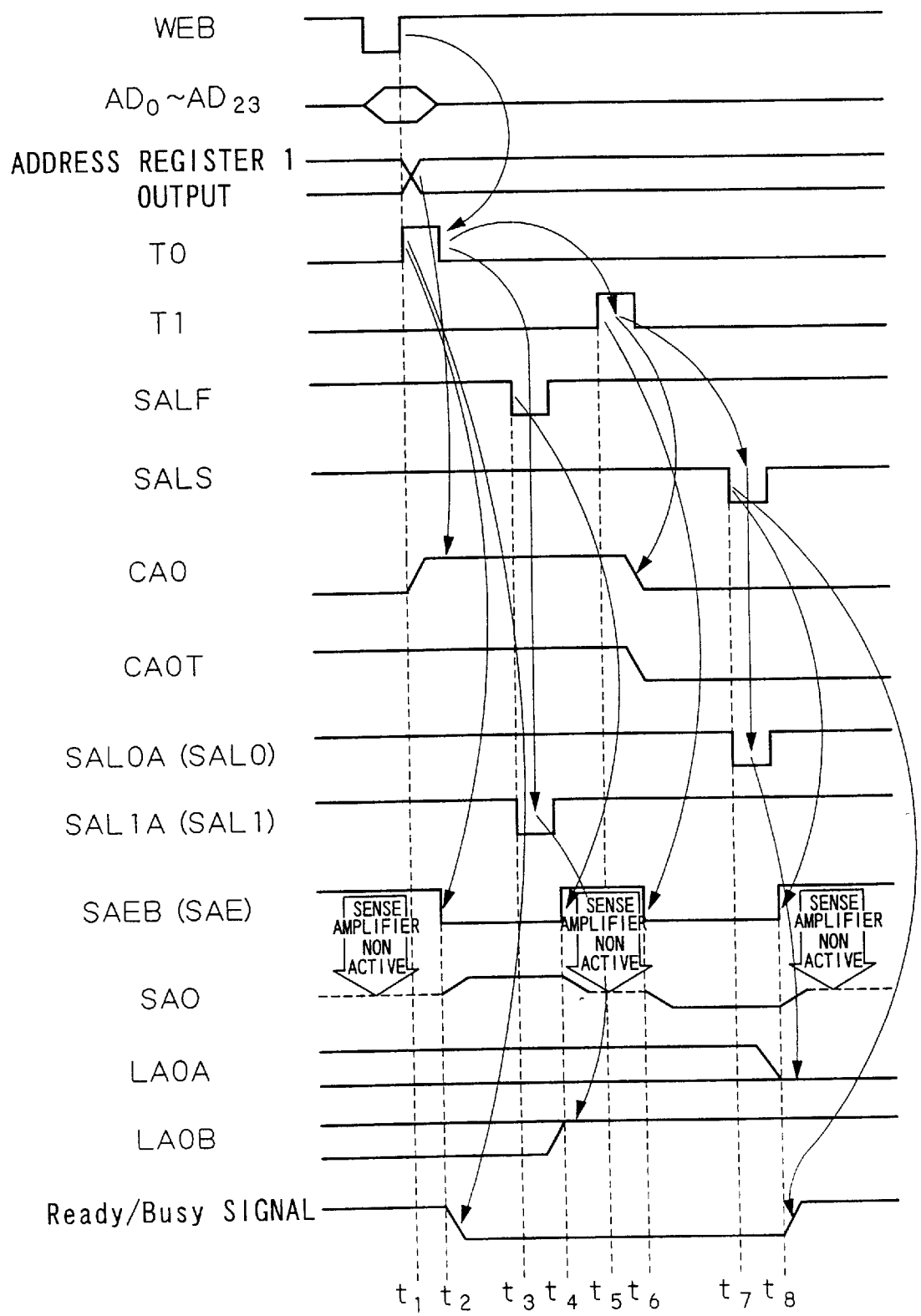
FIG. 11 is a flow chart showing an operational example of a semiconductor memory device according to an embodiment of the present invention.

FIG. 11 is a flow chart showing an operational example, during a latency period, of a semiconductor memory device according to the embodiment, for the case where the control signal CA0T is at level "H" at the beginning of the operation.

Figure 12:
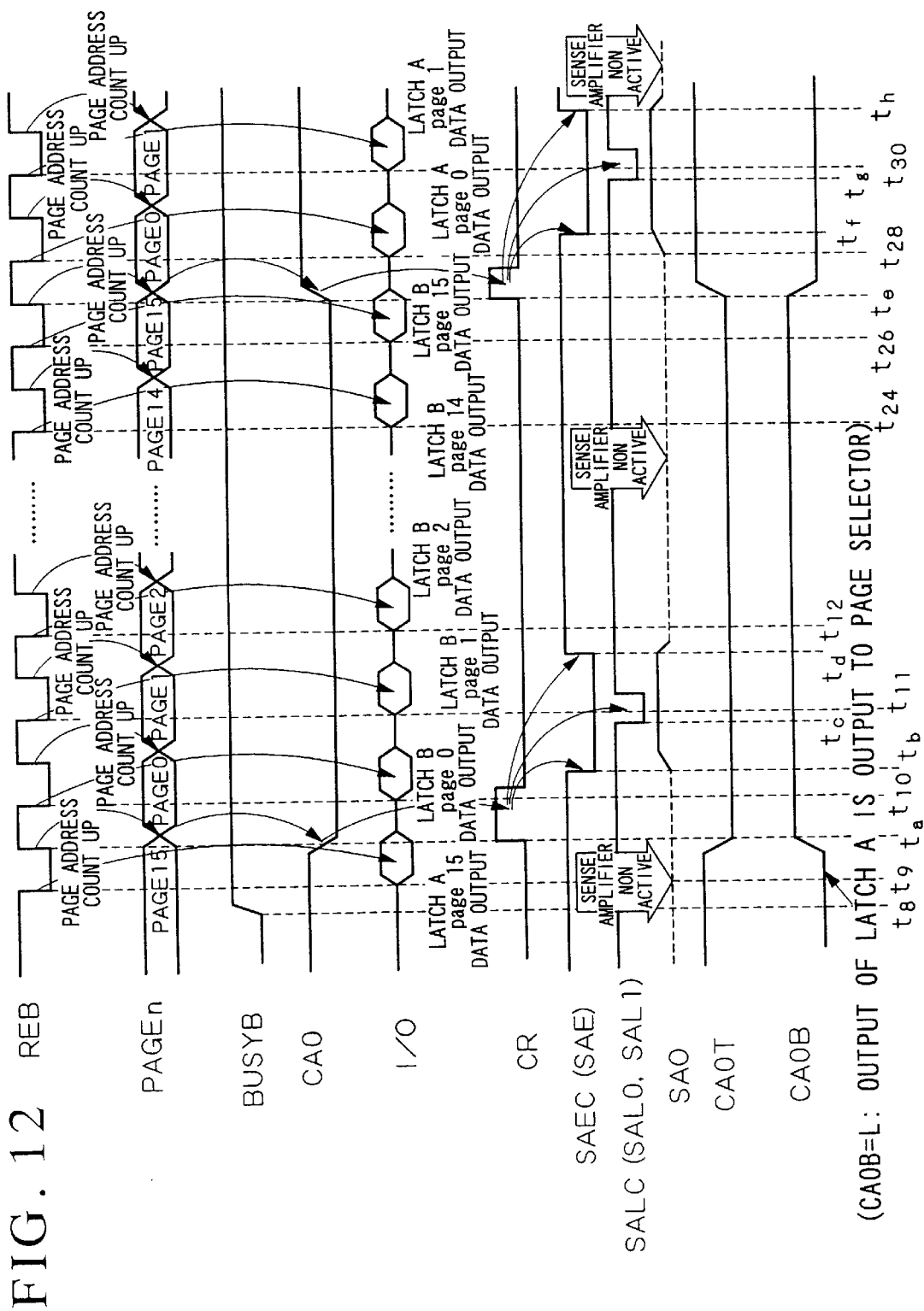
FIG. 12 is a flow chart showing an operational example of a semiconductor memory device according to an embodiment of the present invention.
Figure 13:
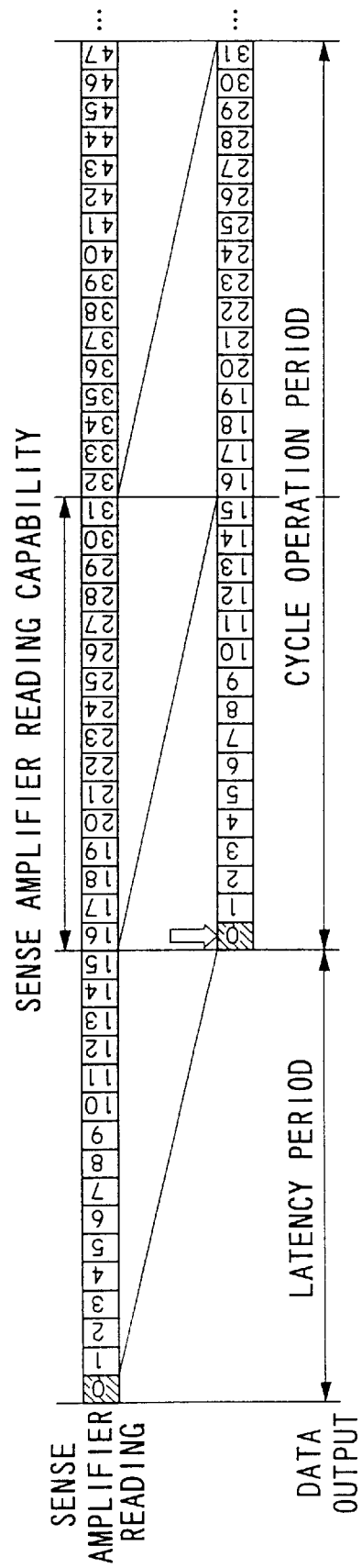
FIG. 13 is a conceptual diagram showing an outline of the data reading/read-out operation of a semiconductor memory device according to a conventional example.
Figure 14:
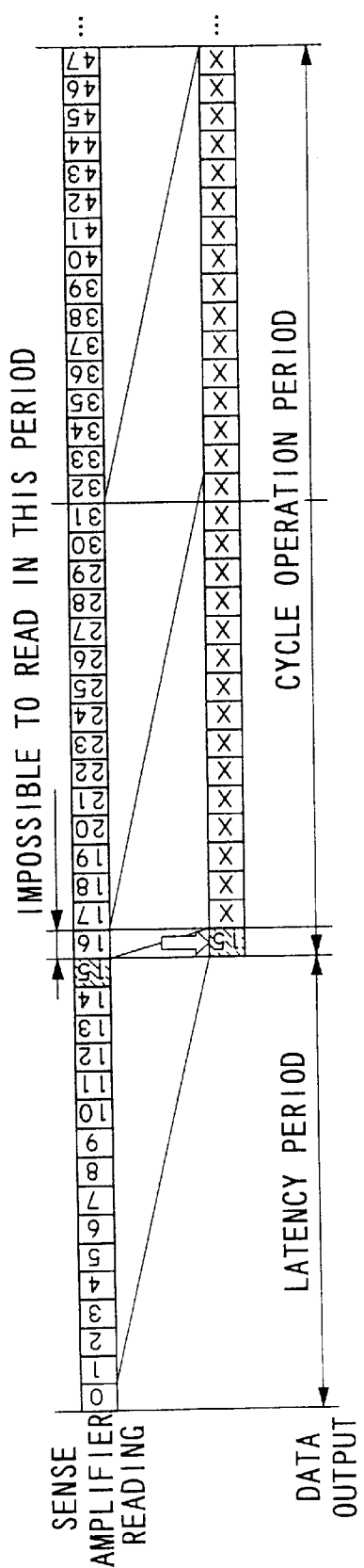
FIG. 14 is a conceptual diagram showing an outline of the data reading/read-out operation of a semiconductor memory device according to a conventional example.

FIG. 12 is a flow chart showing an operational example, during a cyclic operation period, of a semiconductor memory device according to the embodiment, for the case where the control signal CA0T is at level "H" at the beginning of the operation.

At a time t1 in a latency period (the period shown in FIG. 9), at a timing marked by the ring of the control signal WEB from level "L" to level "H", the address signal $AD_0$ to address signal $AD_{23}$ input via the input terminal of the address register 1 is stored in the address register 1.

As a result, the address register 1 outputs the internal address signal A0 to internal address signal A3 to the counter circuit 2D, outputs the internal address signal A4 to internal address signal A13 to the counter circuit 2U, and outputs the row address signal RA5 to row address signal RA14 to the row decoder circuit 10.

Furthermore, the ATD circuit detects any pulse variation in the control signal WEB, and as a result of the detection outputs a one shot pulse control signal T0 at level "H".

Then, at a timing marked by this shift of the control signal T0 to level "H", the counter circuit 2D and the counter circuit 2U take in the address signal $AD_0$~address signal $AD_3$ and the address signal $AD_4$~address signal $AD_{13}$ respectively, input from the address register 1, as initial setting values (starting read address values).

Next, at a time t2, the sense amplifier control circuit 19 causes the control signal SAEB to transition from level "H" to level "L" at a timing marked by the rise of the control signal T0.

At this point, the column decoder circuit 11 switches the Y selector 12 in accordance with the column address signal CA0 to coulm address signal CA4 input from the counter circuit 2U, and outputs the data signal $YD_0$, data signal $YD_1$, ..., data signal $YD_{127}$ to the corresponding sense amplifiers of the sense amplifier circuit 8.

Consequently, a drive current flows through the sense amplifier circuit 8 which is then activated, readout from the memory cell 9 is performed via the word selection line from within the word selection line $WD_0$~word selection line $WD_{163383}$ output from the row decoder circuit 10, and a data evaluation of the data signal $YD_0$ to data signal $YD_{127}$ selected by the control signal $YS_0$ to control signal $YS_{31}$ input from the column decoder circuit 11 is performed, that is an evaluation of whether the data is a "0" or a "1".

Then, as a result of the above evaluation, the sense amplifier circuit 8 outputs the data signal $DT_0$, ..., data signal $DT_{127}$ corresponding to each of the data signals $YD_0$ to data signal $YD_{127}$. In FIG. 11, the output of the data signal $DT_0$ to data signal $DT_{127}$ from the sense amplifier circuit 8 is shown as a dotted line for those portions where the output is deactivated and of an unstable status, and as a solid line for those portions where the output is activated, and evaluated data is being output.

At this time, the BUSY signal generation circuit 20 causes the control signal BUSYB and the control signal READY/BUSY to transition from level "H" to level "L" at a timing marked by the rise of the control signal T0, thereby displaying the status as "currently reading data" (latency state).

Next, at a time t3, the DELAY circuit 5 delays the control signal T0 and outputs a control signal SALF.

At this point, because the column address signal CA0 of the column system address output by the counter circuit 2U, that is, the signal CA0T output by the latch control circuit 17, is of level "H", the latch pulse selection circuit 6 outputs the control signal SAL1A as a level "L" pulse, synchronously with the timing of the output of the level "L" pulse control signal SALF.

Then, because it is within a latency period, the sense amplifier control pulse selection circuit 23 generates a level "L" control signal SAL1 from the control signal SAL1A, and outputs this control signal SAL1 to the latch circuit 7.

As a result, the control circuit 53S outputs a one shot pulse control signal S2 at level "H".

Then, using this level "L" control signal S2, the latch circuit 7 stores the data signal $DT_0$ to data signal $DT_{127}$ input from the sense amplifier circuit 8 in the second latch group.

Consequently, the second latch group outputs the data signal $DTB_0$, the data signal $DTB_1$, . . . , the data signal $DTB_{127}$ from each of the latches LB.

Next, at a time t4, the sense amplifier control circuit 19 raises the control signal SAEB from level "L" to level "H" based on a timing m.

As a result, the sense amplifier control pulse selection circuit 23 raises the control signal SAE from level "L" to level "H".

Consequently, a drive current stops flowing through the sense amplifier circuit 8 which transitions to a deactivated state, and the output signal shifts to an unstable state.

Next, at a time t5, the DELAY circuit 5 outputs the control signal T1 as a level "H" one shot pulse generated by delaying the control signal T0 by a predetermined time delay.

Then, the counter circuit 2U uses the input of the control signal T1 to add "1" to the enumerated value. As a result, the counter circuit 2U outputs the column address signal CA0, which is the least significant address data from the column system, as a level "L" signal.

As a result, the latch control circuit 17 uses the falling of the column address signal CA0 to level "L" to lower the control signal CA0T from level "H" to level "L".

At this point, because the input column address signal CA0 to column address signal CA4 alters (the address is incremented by one), the column decoder circuit 11 switches the Y selector 12, and the next data signal $YD_0$, data signal $YD_1$, . . . , data signal $YD_{127}$ are output to the corresponding sense amplifiers of the sense amplifier circuit 8.

Next, at a time t6, the sense amplifier control circuit 19 lowers the control signal SAEB from level "H" to level "L", at a timing marked by the rise of the control signal T1 from level "L" to level "H".

Consequently, the sense amplifier control pulse selection circuit 23 lowers the control signal SAE from level "H" to level "L".

Then, with the input of a level "L" control signal SAE, a drive current flows through the sense amplifier circuit 8 which switches to an activated state.

As a result, the sense amplifier circuit 8 uses the sense amplifiers to evaluate the data signal $YD_0$ to data signal $YD_{127}$ input from the Y selector 12, and then outputs the results of the evaluation to the latch circuit 7 as the data signal $DT_0$, the data signal $DT_1$, . . . , and the data signal $DT_{127}$.

Next, at a time t7, the DELAY circuit 5 outputs the control signal SALS as a level "L" one shot pulse generated by delaying the control signal T1 by a predetermined time delay.

At this point, because the column address signal CA0 of the column system address output by the counter circuit 2U, that is, the signal CA0T output by the latch control circuit 17, is of level "L", the latch pulse selection circuit 6 outputs the control signal SAL0A as a level "L" pulse, synchronously with the timing of the output of the level "L" pulse control signal SALS.

Then, because it is within a latency period, the sense amplifier control pulse selection circuit 23 generates a level "L" control signal SAL0 from the control signal SAL0A, and outputs this control signal SAL0 to the latch circuit 7.

As a result, the control circuit 53S outputs a one shot pulse control signal S1 at level "H".

Then, using this level "H" control signal S1, the latch circuit 7 stores the data signal $DT_0$~data signal $DT_{127}$ input from the sense amplifier circuit 8 in the first latch group.

Consequently, the first latch group outputs the data signal $DTA_0$, the data signal $DTA_1$, . . . , the data signal $DTA_{127}$ from each of the latches LA.

Next, at a time t8, the sense amplifier control circuit 19 raises the control signal SAEB from level "L" to level "H" at a timing marked by the fall of the control signal SALS generated by the DELAY circuit 5 from level "H" to level "L".

As a result, the sense amplifier control pulse selection circuit 23 raises the control signal SAE from level "L" to level "H".

Consequently, a drive current stops flowing through the sense amplifier circuit 8 which transitions to a deactivated state, and the output signal shifts to an unstable state.

At this point, the BUSY signal generation circuit 20 raises the control signal READY/BUSY and the control signal BUSYB from level "L" to level "H" at a timing marked by the falling of the control signal SALS from level "H" to level "L".

Then, the state of the semiconductor memory device transitions from a latency period to a cyclic operation period.

Furthermore, on detection of the rise to level "H" of the control signal READY/BUSY output to an external output terminal (output pin), external apparatus (not shown in the figures, but including apparatus such as microprocessors) utilizing the semiconductor memory device begin read operations.

Next, at a time t9, the external apparatus not shown in the figures inputs a control signal REB as a level "L" one shot pulse, into the external input pins of the semiconductor memory device in order to begin reading data.

At this point, because the control signal CA0B generated by inversion of the control signal CA0T is at level "L", the latch output selector 10 outputs the data signal $DTA_0$~data signal $DTA_{127}$ stored in the first latch group to the page selector 13 as the respective signals data signal $DL_0$, data signal $DL_1$, . . . , data signal $DL_{127}$.

Then, the page selector 13 outputs 1 byte data corresponding to the page address signal PA0~page address signal PA3 "1111" output by the counter circuit 2D.

As a result, the control signal PAGE0~control signal PAGE15 output by the page decoder 18 will become "1000000000000000".

Consequently, the page selector 13 will output the data signal $DL_7$, the data signal $DL_{15}$, the data signal $DL_{23}$, . . . , and the data signal $DL_{127}$ to the output buffer circuit 14 as the data signal $D_0$, the data signal $D_1$, the data signal $D_2$, . . . , and the data signal $D_7$ respectively.

Then, the output buffer circuit 14 will output the data signal $D_0$, the data signal $D_1$, the data signal $D_2$, . . . , and the data signal $D_7$ (1 page worth of data, PAGE15) from the output terminals (external output pins) $TO_0$~output terminal $TO_7$.

Next, at a time ta, an increment is added to the counter circuit 2D with the rising edge of the control signal REB from level "L" to level "H". As a result, the counter circuit 2D will output the page address signal PA0 to page address signal PA3 as "0000".

At this point, the page address signal PA0 to page address signal PA3 switches from "1111" to "0000", and at the time of this count, the counter circuit 2D outputs the carrier signal CR as a level "H" one shot pulse.

As a result, an increment is added to the address value of the counter circuit 2U, and the column address signal CA0, which is the least significant bit from the column system, transitions from level "L" to level "H".

At this point, the latch control circuit 17 causes the control signal CA0T to transition from level "H" to level "L", and the control signal CA0B to transition from level "L" to level "H".

Then, the latch output selector 10 switches from the first latch group, and outputs the data signal $DTB_0$ to data signal $DTB_{127}$ stored in the second latch group, as the data signal $DL_0$, the data signal $DL_1$, . . . , and the data signal $DL_{127}$ respectively, to the page selector 13.

Next, at a time t10, because the control signal CA0B generated by inversion of the control signal CA0T is at level "H", the latch output selector 10 outputs the data signal $DTB_0$~data signal $DTB_{127}$ stored in the second latch group to the page selector 13 as the respective signals data signal $DL_0$, data signal $DL_1$, . . . , data signal $DL_{127}$, at a timing marked by the falling edge of the control signal REB from level "H" to level "L".

Then, the page selector 13 outputs 1 byte data corresponding to the page address signal PA0 to page address signal PA3 "0000" output by the counter circuit 2D.

As a result, the control signal PAGE0 to control signal PAGE15 output by the page decoder 18 will become "0000000000000001".

Consequently, the page selector 13 will output the data signal $DL_0$, the data signal $DL_8$, the data signal $DL_{16}$, . . . , and the data signal $DL_{120}$, to the output buffer circuit 14 as the data signal $D_0$, the data signal $D_1$, the data signal $D_2$, . . . , and the data signal $D_7$ respectively.

Then, the output buffer circuit 14 will output the data signal $D_0$, the data signal $D_1$, the data signal $D_2$, . . . , and the data signal $D_7$ (1 page worth of data, PAGE0) from the output terminals (external output pins) $TO_0$~output terminal $TO_7$.

Next, at a time tb, the DELAY circuit 22 generates the control signal SAEC as a level "L" one shot pulse of a predetermined width (from time tb to time td) from the carrier signal CR.

Then, in order to transition the sense amplifier circuit 8 from a deactivated state to an activated state, the sense amplifier control pulse selection circuit 23 generates the control signal SAE from the control signal SAEC, and then outputs the control signal SAE to the sense amplifier circuit 8.

At this time, the column decoder circuit 11 generates the control signal $YD_0$ to control signal $YD_{31}$ based on the incremented and altered column register signal CA0 to column address signal CA4, and outputs the generated signal to the Y selector 12.

Then, based on the control signal $YS_0$~control signal $YS_{31}$, the Y selector 12 selects the data signal $DG_0$ to data signal $DG_{4095}$ read from the memory cell 9 and outputs the result to the sense amplifier circuit 8 as the data signal $YD_0$ to data signal $YD_{127}$.

Consequently, a drive current flows through the sense amplifier circuit 8 which becomes activated, and so an evaluation of the data signal $YD_0$~data signal $YD_{127}$ input from the Y selector 7 is performed, and the data signal $DT_0$, the data signal $DT_1$, . . . , and the data signal $DT_{127}$ respectively are output to the latch circuit 7.

Next, at a time tc, based on the carrier signal CR, the DELAY circuit 22 applies a predetermined time delay to the control signal TC obtained from the ATD circuit 21, and outputs the control signal SALC, as a level "L" one shot pulse, to the sense amplifier control pulse selection circuit 23.

At this point, the column address signal CA0 of the column system address output from the counter circuit 2U, namely, the control signal CA0T output by the latch control circuit 17, is at level "L".

Then, because it is within a cyclic operation period, the sense amplifier control pulse selection circuit 23 generates a level "L" one shot pulse control signal SAL0 from the control signal SALC, and outputs the control signal SAL0 to the latch circuit 7.

As a result, the control signal CA0T is at level "L", and the control circuit 53S outputs a one shot pulse control signal S1 at level "H".

Then, using this level "H" control signal S1, the latch circuit 7 stores the data signal $DT_0$ to data signal $DT_{127}$, input from the sense amplifier circuit 8 in the first latch group.

Consequently, the first latch group outputs the data signal $DTA_0$, the data signal $DTA_1$, . . . , the data signal $DTA_{127}$ from each of the latches LA.

Next, at a time t11, in order to read the data, the external apparatus not shown in the figures, inputs a level "L" one shot pulse control signal REB into the external input pins of the semiconductor memory device.

At this point, because the control signal CA0B generated by inversion of the control signal CA0T is at level "H", the latch output selector 10 outputs the data signal $DTB_0$ to data signal $DTB_{127}$ stored in the second latch group to the page selector 13 as the respective signals data signal $DL_0$, data signal $DL_1$, . . . , data signal $DL_{127}$.

Then, the page selector 13 outputs 1 byte data corresponding to the page address signal PA0 to page address signal PA3 output by the counter circuit 2D.

Namely, the counter circuit 2D is such that the page address signal PA0~page address signal PA3 is "0001", and so the control signal PAGE0 to control signal PAGE15 output by the page decoder 18 will be "0000000000000010".

Consequently, the page selector 13 will output the data signal $DL_1$, the data signal $DL_9$, the data signal $DL_{17}$, . . . , and the data signal $DL_{121}$ to the output buffer circuit 14 as the data signal $D_0$, the data signal $D_1$, the data signal $D_2$, . . . , and the data signal D, respectively.

Next, at a time td, in order to make the DELAY control circuit 22 transition the control signal SAEC from level "L" to level "H", the sense amplifier control pulse selection circuit 23 raises the control signal SAE from level "L" to level "H".

Consequently, a drive current stops flowing through the sense amplifier circuit 8 which transitions from an activated state to a deactivated state.

Subsequent operations shown at the time t12 time t24, are a repeat of the operations described with reference to FIG. 9 to FIG. 12, and so the description is omitted.

Next, at a time t26, in order to read the next data, the external apparatus not shown in the figures, inputs another level "L" one shot pulse control signal REB into the external input pins of the semiconductor memory device.

At this point, because the control signal CA0B generated by inversion of the control signal CA0T is at level "H", the latch output selector 10 outputs the data signal $DTB_0$ to data signal $DTB_{127}$ stored in the second latch group to the page selector 13 as the respective signals data signal $DL_0$, data signal $DL_1$, ..., data signal $DL_{127}$.

Then, the page selector 13 outputs 1 byte data corresponding to the page address signal PA0 to page address signal PA3 "1111" output by the counter circuit 2D.

As a result, the control signal PAGE0 to control signal PAGE15 output by the page decoder 18 will become "1000000000000000".

Consequently, the page selector 13 will output the data signal $DL_7$, the data signal $DL_{15}$, the data signal $DL_{23}$, ..., and the data signal $DL_{127}$ to the output buffer circuit 14 as the data signal $D_0$, the data signal $D_1$, the data signal $D_2$, ..., and the data signal $D_7$ respectively.

Then, the output buffer circuit 14 will output the data signal $D_0$, the data signal $D_1$, the data signal $D_2$, ..., and the data signal $D_7$ (1 page worth of data, PAGE15) from the output terminal $TO_0$ to output terminal $TO_7$.

Next, at a time te, an increment is added to the counter circuit 2D with the rising edge of the control signal REB from level "L" to level "H". As a result, the counter circuit 2D will output the page address signal PA0~page address signal PA3 as "0000".

At this point, the page address signal PA0~page address signal PA3 switches from "1111" to "0000", and at the time of this count, the counter circuit 2D outputs the carrier signal CR as a level "H" one shot pulse.

As a result, an increment is added to the address value of the counter circuit 2U, and the column address signal CA0, which is the least significant bit from the column system, transitions from level "L" to level "H".

At this point, the latch control circuit 17 causes the control signal CA0T to transition from level "L" to level "H", and the control signal CA0B to transition from level "H", to level "L".

Then, the latch output selector 10 switches from the second latch group, and outputs the data signal $DTA_0$~data signal $DTA_{127}$, stored in the first latch group, as the data signal $DL_0$, the data signal $DL_1$, ..., and the data signal $DL_{127}$ respectively, to the page selector 13.

Next, at a time t28, in order to read the next data, the external apparatus not shown in the figures, inputs another level "L" one shot pulse control signal REB into the external input pins of the semiconductor memory device.

At this point, because the control signal CA0B generated by inversion of the control signal CA0T is at level "L", the latch output selector 10 outputs the data signal $DTA_0$~data signal $DTA_{127}$ stored in the first latch group to the page selector 13 as the respective signals data signal $DL_0$, data signal $DL_1$, ..., data signal $DL_{127}$.

Then, the page selector 13 outputs 1 byte data corresponding to the initial state page address signal PA0~page address signal PA3 "0000" output by the counter circuit 2D.

As a result, the control signal PAGE0~control signal PAGE15 output by the page decoder 18 will become "0000000000000001".

Consequently, the page selector 13 will output the data signal $DL_0$, the data signal $DL_8$, the data signal $DL_{16}$, ..., and the data signal $DL_{120}$ to the output buffer circuit 14 as the data signal $D_0$, the data signal $D_1$, the data signal $D_2$, ..., and the data signal $D_7$ respectively.

Then, the output buffer circuit 14 will output the data signal $D_0$, the data signal $D_1$, the data signal $D_2$, ..., and the data signal $D_7$ (1 page worth of data, PAGE0) from the output terminal $TO_0$ to output terminal $TO_7$.

Next, at a time tf, the DELAY circuit 22 generates the control signal SAEC as a level "L" one shot pulse of a predetermined width (from time tf~time th) from the carrier signal CR.

Then, in order to transition the sense amplifier circuit 8 from a deactivated state to an activated state, the sense amplifier control pulse selection circuit 23 generates the control signal SAE from the control signal SAEC, and then outputs the control signal SAE to the sense amplifier circuit 8.

At this time, the column decoder circuit 11 generates the control signal $YD_0$~control signal $YD_{31}$ based on the incremented and altered column register signal CA0~column address signal CA4, and outputs the generated signal to the Y selector 12.

Then, based on the control signal $YS_0$~control signal $YS_{31}$, the Y selector 12 selects the data signal $DG_0$~data signal $DG_{4095}$ read from the memory cell 9 and outputs the result to the sense amplifier circuit 8 as the data signal $YD_0$~data signal $YD_{127}$.

Consequently, a drive current flows through the sense amplifier circuit 8 which becomes activated, and so an evaluation of the data signal $YD_0$~data Signal $YD_{127}$ input from the Y selector 7 is performed, and as a result the data signal $DT_0$, the data signal $DT_1$, ..., and the data signal $DT_{127}$ respectively are output to the latch circuit 7.

Next, at a time tg, based on the carrier signal CR, the DELAY circuit 22 applies a predetermined time delay to the control signal TC obtained from the ATD circuit 21, and outputs the control signal SALC, as a level "L" one shot pulse, to the sense amplifier control pulse selection circuit 23.

At this point, the column address signal CA0 of the column system address output from the counter circuit 2U, namely, the control signal CA0T output by the latch control circuit 17, is at level "H".

Then, because it is within a cyclic operation period, the sense amplifier control pulse selection circuit 23 generates a level "L" one shot pulse control signal SAL1 from the control signal SALC, and outputs the control signal SAL1 to the latch circuit 7.

As a result, the control signal CA0T is at level "H", and the control circuit 53S outputs a one shot pulse control signal S2 at level "H".

Then, using this level "H" control signal S2, the latch circuit 7 stores the data signal $DT_0$~data signal $DT_{127}$ input from the sense amplifier circuit 8 in the second latch group.

Consequently, the second latch group outputs the data signal $DTB_0$, the data signal $DTB_1$, ..., the data signal $DTB_{127}$ from each of the latches LB.

Next, at a time t30, in order to read the data, the external apparatus not shown in the figures, inputs a level "L" one shot pulse control signal REB into the external input pins of the semiconductor memory device.

At this point, because the control signal CA0B generated by inversion of the control signal CA0T is at level "L", the latch output selector 10 outputs the data signal $DTA_0$~data signal $DTA_{127}$ stored in the first latch group to the page selector 13 as the respective signals data signal $DL_0$, data signal $DL_1$, ..., data signal $DL_{127}$.

Then, the page selector 13 outputs 1 byte data corresponding to the page address signal PA0~page address signal PA3 output by the counter circuit 2D.

Namely, the counter circuit 2D is in a state where the page address signal PA0~page address signal PA3 is "0001", and so the control signal PAGE0~control signal PAGE15 output by the page decoder 18 will be "0000000000000010".

Consequently, the page selector 13 will output the data signal $DL_1$, the data signal $DL_9$, the data signal $DL_{17}$, ..., and the data signal $DL_{121}$ to the output buffer circuit 14 as the data signal $D_0$, the data signal $D_1$, the data signal $D_2$, ..., and the data signal $D_7$ respectively.

Next, at a time th, in order to make the DELAY control circuit 22 transition the control signal SAEC from level "L" to level "H", the sense amplifier control pulse selection circuit 23 raises the control signal SAE from level "L" to level "H".

Consequently, a drive current stops flowing through the sense amplifier circuit 8 which transitions from an activated state to a deactivated state.

Subsequent operations differ only in whether the control signal CA0T is at level "L" or level "H", and in variations in the latch group selected. Because the actual operations are merely a repeat of those described above for the time t8~time th, further description is omitted.

In the semiconductor memory device of the present invention described above, as described in the timing charts of in FIG. 11 and FIG. 12, in order to complete the read processing of 32 bytes of data, comprising 16 bytes in each of the first latch group and the second latch group, during the latency period, then even in the case of random access from a halfway (a large set value) address value in the counter circuit 2D which outputs the page address signal PA0~page address signal PA3 for controlling the page decoder 18, such as the case where one latch group does not read data from the first byte "1", but from the fifteenth byte "15", there is still the time available while the data of byte "16"~byte "31" stored in the other latch group is output from the output terminal, which is sufficient time to enable reading of the next data from byte "32"~byte "47" into the former latch group and maintenance of the evaluation time of the sense amplifier data in the sense amplifier circuit 8. As a result, continuous data output is possible, thereby enabling an improvement in access times.

Furthermore, because the number of sense amplifiers is reduced in the semiconductor memory device of the present invention described above, the drive current required to drive the sense amplifiers can be reduced, enabling a reduction in power consumption, and furthermore, because the sense amplifier drive period is limited to the period during which data is being stored in the latch circuit 7, a further reduction in power consumption is possible.

As a result, the semiconductor memory device described above enables a significant reduction in power consumption, which in the case of use within a portable information apparatus, equates to an extension in the operating time of the portable information apparatus.

In addition, during latency (BUSY) periods, the semiconductor memory device described above detects whether the first latch group and the second latch group of the latch circuit 7 have completed data reading, and in those cases where data reading is detected as having been completed, outputs a signal BUSY to external circuits or external apparatus and consequently, the external circuits or external apparatus are able to alter, and for example shorten, the random access times, in accordance with the access times of the semiconductor memory device.

In the above description, the invention was described with reference to a mask ROM construction, but the present invention is not limited to mask ROMs, and can be effectively applied to EPROM (programmable ROM), EEPROM (electrically erasable programmable ROM), and flash memory and the like, with an object of enabling high speed reading and achieving power conservation.

The embodiment of the present invention is described in detail above with reference to the drawings, but the present invention is not limited to the specific construction of the embodiment described, and incorporates various design variations which retain the gist of the present invention.

As described above, according to a semiconductor memory device of the present invention, in order to complete the read processing of data to the first latch group and the second latch group during the latency period, then even in the case of random access in terms of the address value where, for example, the first latch group does not read data from the first byte "1" but rather from the last byte, there is still the time available while the data of byte "16"~byte "31" stored in the second latch group is output from the output terminal, which is sufficient time to enable reading of the next data from byte "32"~byte "47" into the first latch group and maintenance of the evaluation time of the sense amplifier data in the sense amplifier circuit 8. As a result, continuous data output is possible, thereby enabling an improvement in access times.

Furthermore, according to a semiconductor memory device of the present invention, because a first latch group and a second latch group are provided, with the two groups outputting stored data from the output terminal alternately, then while the data stored in one of the latch groups is being read, the next set of data is being stored in the other latch group from a sense amplifier, and so the sense amplifier data evaluation time can be ensured, and a construction is possible where the digit lines connected to the memory cell are divided into a plurality of groups, and one of these groups is then selected by a selector circuit and connected to the sense amplifier, and an information current is supplied to the sense amplifier. Consequently, compared with constructions where a sense amplifier is provided for every digit line, the number of sense amplifiers required for performing evaluation of the data which is read to the digit lines from the memory transistors is able to be reduced, and furthermore, even in a construction with a reduced number of sense amplifiers where burst reading from a random address is possible, the sense amplifier data evaluation time is ensured, and so data can be read with no loss of output rate resulting from the switching over of the latches.

Consequently, according to the semiconductor memory device described above, the chip surface area is able to be reduced by an area equivalent to the reduction in the number of sense amplifiers, which enables a reduction in production costs.

Moreover, according to a semiconductor memory device of the present invention, because the number of sense amplifiers is reduced, the drive current required to drive the sense amplifiers can be reduced, enabling a reduction in power consumption, and furthermore, because the sense amplifier drive period is limited to the periods during which data is being stored in either the first latch group or the second latch group, a further reduction in power consumption is possible.

Namely, in conventional examples, the sense amplifier is required to retain the evaluated data until the data is transferred to a shift register, and because the transfer time for a piece of evaluated data is at the point where output of the data from two bytes previous has been completed, the sense amplifier is never inactive.

In contrast, according to a semiconductor memory device of the present invention, because two latch groups, namely a first latch group and a second latch group, are provided, when data is being read from one of the latch groups, then at the point that sense (data evaluation) operations have been completed in the sense amplifier, an evaluation result is sent to the other latch group, and because data is always transferred from the sense amplifier to one of the latch groups, there is no necessity for the sense amplifier to retain the data, meaning that following transferal of the data the sense amplifier can transition to a deactivated state.

Consequently, in the semiconductor memory device described above, the number of sense amplifiers is reduced, and moreover, a deactivated period is also provided for the sense amplifier, enabling a significant reduction in power consumption, which in the case of use within a portable information apparatus, equates to an extension in the operating time of the portable information apparatus in comparison to conventional devices.

In addition, according to a semiconductor memory device of the present invention, during busy periods, a detection is conducted of whether the first latch group and the second latch group have completed data reading, and in those cases where data reading is detected as having been completed, a signal BUSY is output to external circuits or external apparatus and consequently, the external circuits or external apparatus are able to alter, and for example shorten, the random access times, in accordance with the access times of the semiconductor memory device.

What is claimed is:

1. A semiconductor memory device comprising:
   a memory cell array with a plurality of arranged memory cells which are selected by a column address and a row address;
   a bit line selection circuit for selecting based on said column address a group comprising a predetermined number of bit lines, from bit lines connected with said plurality of memory cells selected by said row address;
   a sense amplifier section comprised of sense amplifiers for determining data for each bit line output signals from memory cells input through said plurality of bit lines of said selected group, and outputting data from each of said bit lines as an determination result,
   a first latch group and a second latch group connected in common to said sense amplifier section, for storing said data of each bit line output from said sense amplifier section, and
   a latch selection circuit for selecting which of said first latch group data and said second latch group data to output, and then outputting a selection result as read data,
   wherein during burst read operation, in cases where data of said first latch group is being output as read data, said second latch group stores data from said sense amplifier, and in cases where data of said second latch group is being output as read data, said first latch group stores data from said sense amplifier.

2. A semiconductor memory device according to claim 1, wherein said first latch group and said second latch group latch continuous data during a latency period.

3. A semiconductor memory device according to claim 1 further equipped with a sense amplifier control device, wherein when data is being stored from said sense amplifier into either one of said first latch group and said second latch group, said sense amplifier is set to an active state, and when data has been stored in either one of said first latch group and said second latch group, said sense amplifier is set to a non-active state.

4. A semiconductor memory device according to claim 1, further comprising a detection signal generation circuit for detecting, during latching of continuous data to said first latch group and said second latch group during a latency period, when latching of data from both said first latch group and said second latch group has been completed, and outputting a detection signal.

5. A semiconductor memory device according to claim 1, further comprising a counter for setting an input address as an initial value for a burst read column address, and counting from said set initial value each time a read signal is input, and generating a burst address.

6. A semiconductor memory device according to claim 5, wherein said counter comprises a first counter for generating a burst address for selecting which of said read data output from said first latch and said second latch will be output from an output terminal, and a second counter for generating a burst address which functions as a selection signal for selecting, from bit lines connected to said selected memory cell, bit lines of said group for connection to a sense amplifier.

7. A semiconductor memory device according to claim 5, wherein said counter comprises a first counter for generating a burst address for selecting which of said read data output from said first latch and said second latch will be output from an output terminal, a second counter for generating a burst address which functions as a selection signal for selecting from bit lines connected to said selected memory cell, bit lines of said group for connection to a sense amplifier, and a third counter for generating a burst address which functions as a column address.

8. A method of reading data from a semiconductor memory device comprising:
   a first step for selecting, from a memory array with a plurality of arranged memory cells which are selected by a column address and a row address, a plurality of said memory cells based on said row address,
   a second step in which a bit line selection circuit selects a group comprising a predetermined number of bit lines, based on said column address, from bit lines connected with selected said plurality of memory cells,
   a third step in which a sense amplifier section determines output signals from memory cells, input via said plurality of bit lines of said selected group, using a sense amplifier corresponding with each bit line, and outputs data from each of said bit lines as an evaluation result,
   a fourth step in which either one of a first latch and a second latch connected in common to said sense amplifier section stores said data of each bit line output from said sense amplifier section, and
   a fifth step in which a latch selection circuit selects which of said first latch data and said second latch data to output, and then outputs selected latch data as read data, wherein during burst read operation, in cases where data of said first latch is being output as read data, said second latch stores data from said sense amplifier, and in cases where data of said second latch is being output as read data, said first latch stores data from said sense amplifier.

9. A method of reading data from a semiconductor memory device according to claim 8, wherein said first latch group and said second latch group latch continuous data during a latency period.

10. A method of reading data from a semiconductor memory device according to claim 8, further comprising a sense amplifier control device, wherein when data is being stored from said sense amplifier into either one of said first latch group and said second latch group, said sense amplifier is set to an active state, and when data has been stored in either one of said first latch group and said second latch group, said sense amplifier is set to a non-active state.

11. A method of reading data from a semiconductor memory device according to claim 8, further comprising a detection signal generation circuit for detecting, during latching of continuous data to said first latch group and said second latch group during a latency period, when latching of data from both said first latch group and said second latch group has been completed, and outputting a detection signal.

* * * * *